United States Patent [19]
Ito

[11] Patent Number: 5,483,131
[45] Date of Patent: Jan. 9, 1996

[54] SELF-STARTING SWINGING APPARATUS

[75] Inventor: Reijiro Ito, Tokyo, Japan

[73] Assignee: Kokusai Display Kogyo Co., Ltd., Tokyo, Japan

[21] Appl. No.: 124,607

[22] Filed: Sep. 21, 1993

[30] Foreign Application Priority Data

Sep. 22, 1992 [JP] Japan ............................ 4-294695

[51] Int. Cl.$^6$ ............................................ H02P 1/16
[52] U.S. Cl. ........................... 318/130; 318/129; 318/126
[58] Field of Search .................................. 318/119, 126, 318/127, 128, 129, 130, 131, 132, 133, 134; 323/906

[56] References Cited

U.S. PATENT DOCUMENTS

| 3,443,242 | 5/1969 | Reich | 331/71 |
| 3,474,314 | 10/1969 | Ito | 318/128 |
| 3,973,571 | 8/1976 | Suhel | 128/408 |
| 5,086,267 | 1/1991 | Janda et al. | 323/906 X |

FOREIGN PATENT DOCUMENTS

| 2239054 | 2/1975 | France . |
| 2283588 | 3/1976 | France . |
| 1713126 | 11/1955 | Germany . |
| 1166101 | 3/1964 | Germany . |
| 1166705 | 3/1964 | Germany . |
| 1909543 | 9/1970 | Germany . |

Primary Examiner—Thomas M. Dougherty
Assistant Examiner—Judson H. Jones
Attorney, Agent, or Firm—Rothwell, Figg, Ernst & Kurz

[57] ABSTRACT

A self-starting swinging apparatus including a free-running oscillation circuit comprising two transistors which are a PNP transistor and an NPN transistor, the bases of both transistors being connected respectively to the collector of one transistor directly and to the collector of the other transistor through a capacitor for setting a time constant; a driving coil connected to the collector of the transistor with the capacitor connected thereto, as a load on the transistor; and a permanent magnet having a relatively repulsive magnetic pole arrangement of the same polarity as, or having a relatively attractive magnetic pole arrangement of a different polarity from, that of a magnetic pole in a magnetic field which ought to be generated in the driving coil when an electric current is fed to the driving coil from the oscillation circuit, the permanent magnet being relatively movable with respect to the driving coil and capable of performing a relative swing motion under the action of an arbitrary restoring force, one of the permanent magnet and the driving coil being fixed to a swinging side and the other fixed to a stationary side in a position near or deviated from a neutral point of a swing motion of the swinging side.

2 Claims, 13 Drawing Sheets

SELF-STARTING SWINGING APPARATUS

BACKGROUND OF THE INVENTION

The present invention relates to a self-starting swinging apparatus and more particularly to a self-starting swinging apparatus capable of being utilized as a driving apparatus for swinging toys and ornaments as interior accessories, also as a moving display in the shop window for advertisement, as a driving apparatus for swinging a part of a signboard, and further as a driving apparatus for a swinging sculptural shape for outdoor use.

DESCRIPTION OF THE PRIOR ART

Heretofore, there has been an electromagnetic driving apparatus in which, the moment a permanent magnet attached to one end of a pendulum and a fixed electromagnet opposed to the permanent magnet through a slight spacing face each other twice for each reciprocation of pendulum swing, the pendulum swing is energized at every half of reciprocation by electromagnetic forces exerted on the permanent magnet of the pendulum and the fixed electromagnet excited through the supply of electric power at electric contacts or through contactless electrification using a semiconductor and using detected signals provided from detector means for detecting the position and motion of the permanent magnet.

Such conventional apparatus is utilized as a driving apparatus for interior accessories or for POP (point of purchase) advertising, but premises that the swing motion of the pendulum can be manually started easily in the interior of a room. Because such conventional apparatus does not have a self-starting function, it has been impossible to utilize it in a place difficult to reach, for example in the case of swinging a part of a signboard.

In view of such inconvenience there has been proposed such a self-starting type, contactless, electromagnetic driving apparatus as disclosed in U.S. Pat. No. 3,474,314. This apparatus will now be described with reference to FIG. 1. A driving coil 4 and a detecting coil 5 are wound round an iron core 6 of an electromagnet 6a, and an electric current from an AC power source 2 is applied between the anode and the cathode of a thyristor SCR 3 via the driving coil 4. The detecting coil 5 is connected between the gate and the cathode of the SCR 3, and the instant at which the position of a permanent magnet 7 attached Lo the lower end of a pendulum shifts away from the position (a neutral point of swing motion) just above the electromagnet 6a at the time of pendulum swing is detected by the detecting coil 5 using a power generating action thereof, whereupon the SCR 3 is rendered conductive, thus causing a half-wave rectification current to flow through the driving coil 4 and a repulsive electromagnetic force to be exerted on the permanent magnet 7 to swing the pendulum indicated at 8.

The above conventional technique is characteristic in that a start control circuit of series-parallel connection comprising a diode 1 having a rectifying direction opposite to that of the SCR 3, a resistor r1, a capacitor c1 and a resistor r2 connected in parallel with the capacitor c1 is connected between the anode and the cathode of the SCR 3. According to this construction, upon application of an AC voltage to the circuit by operating a switch 9, an electric current flows in the above start control circuit and a secondary induced current is fed to the detecting coil 5 even when power generation in the same coil cannot be done still in a stationary state of the pendulum 8, to turn ON the SCR 3, allowing an electric current to flow in the driving coil 4 and the permanent magnet 7 mounted at the end of the pendulum to operate in a repulsive state. In this way the swing motion of the pendulum is started.

However, the following problem is involved in the above conventional apparatus. In the case where design panels 11 are attached to and moved by the pendulum 8, as part of a signboard, and when the panels are pushed and temporarily stopped by wind, or when a child has forcibly stopped the movement of a doll displayed in the shop window and moved by the pendulum 8, the pendulum 8 sometimes remains stopped after the wind went down or after such forced stop, because of no power generation in the detecting coil 5.

FIG. 2 illustrates a known free-running oscillation circuit, which has heretofore been used for flashing in the illumination using an incandescent lamp 10. In this circuit, a base-to-emitter resistor R3 and the collector of an NPN transistor TrN are connected to the base of a PNP transistor TrP. Resistors R1 and R2 connected to plus and minus of a power source are connected to the base of the NPN transistor TrN, and the base of the transistor TrN is connected to the collector of the transistor TrP through a capacitor C11 for setting a timer time constant. Further, the emitters of both transistors TrP and TrN are connected to plus and minus, respectively, of a DC power source, and the incandescent lamp 10 is connected between the collector of the PNP transistor TrP and the minus of the power source.

SUMMARY OF THE INVENTION

Accordingly, it is an object of the present invention to permit the pendulum 8 which is driven by a relative electromagnetic force of the permanent magnet and an electromagnet or the driving coil 4 to start automatically by itself after release of a restraint force of the pendulum without restriction at the time application of electric power.

It is another object of the present invention to provide a circuit which utilizes a solar battery, namely, the energy of light, to permit automatic starting of a swing motion, thereby permitting the fabrication of maintenance-free and swinging ornaments as interior accessories or advertisements.

It is a further object of the present invention to provide a power circuit in a driving apparatus for self-starting which circuit does not malfunction even when used as a general-purpose DC power source common to a certain electronic device circuit emitting a noise signal on the power supply side and which circuit prevents the apparatus of the invention from emitting a noise signal.

It is a still further object of the present invention to provide an energy-saving pendulum driving apparatus of high efficiency wherein an electric current generated in a circuit during swing motion and affecting pendulum damping is blocked by a diode.

Thus, according to the present invention, there is provided a pendulum driving apparatus exhibiting a self-starting function and capable of attaining the reduction of cost, a long service life, saving of energy and high reliability; further, without using the conventional detecting coil, there is used a fine driving coil of a large number of turns which is energized every time a conventional permanent magnet becomes opposed to the driving coils and the winding of such driving coil can be made thicker and larger in the number of turns to attain the reduction of cost.

DETAILED DESCRIPTION OF PREFERRED EMBODIMENTS

Figure 1:
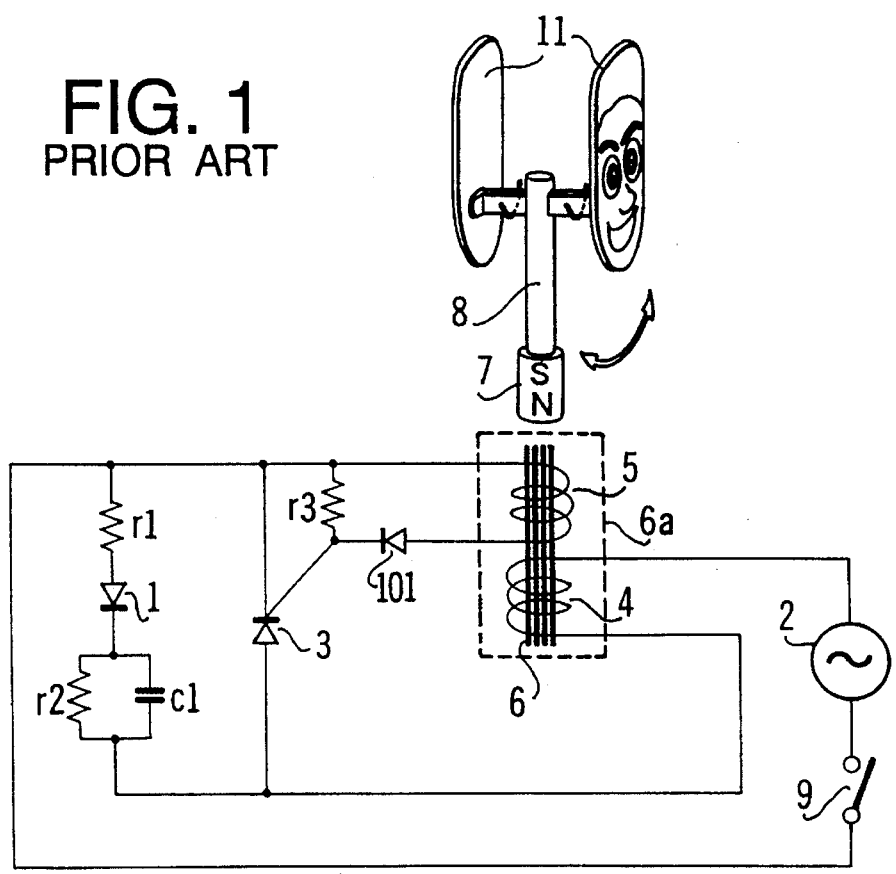
FIG. 1 is a connection diagram with a perspective view of a pendulum according to a prior art.
Figure 2:
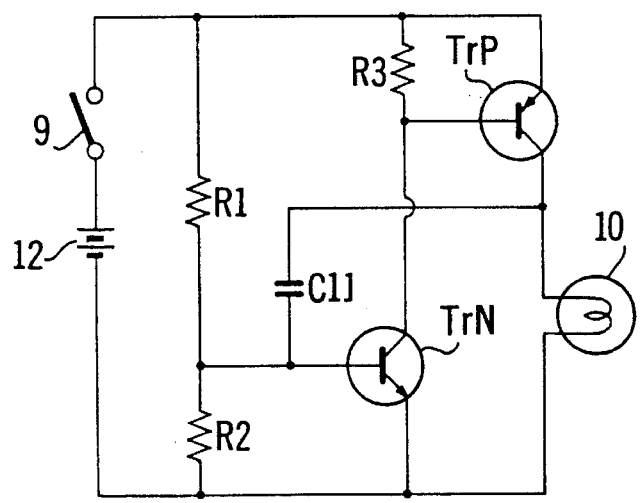
FIG. 2 is a connection diagram according to another prior art.
Figure 3:
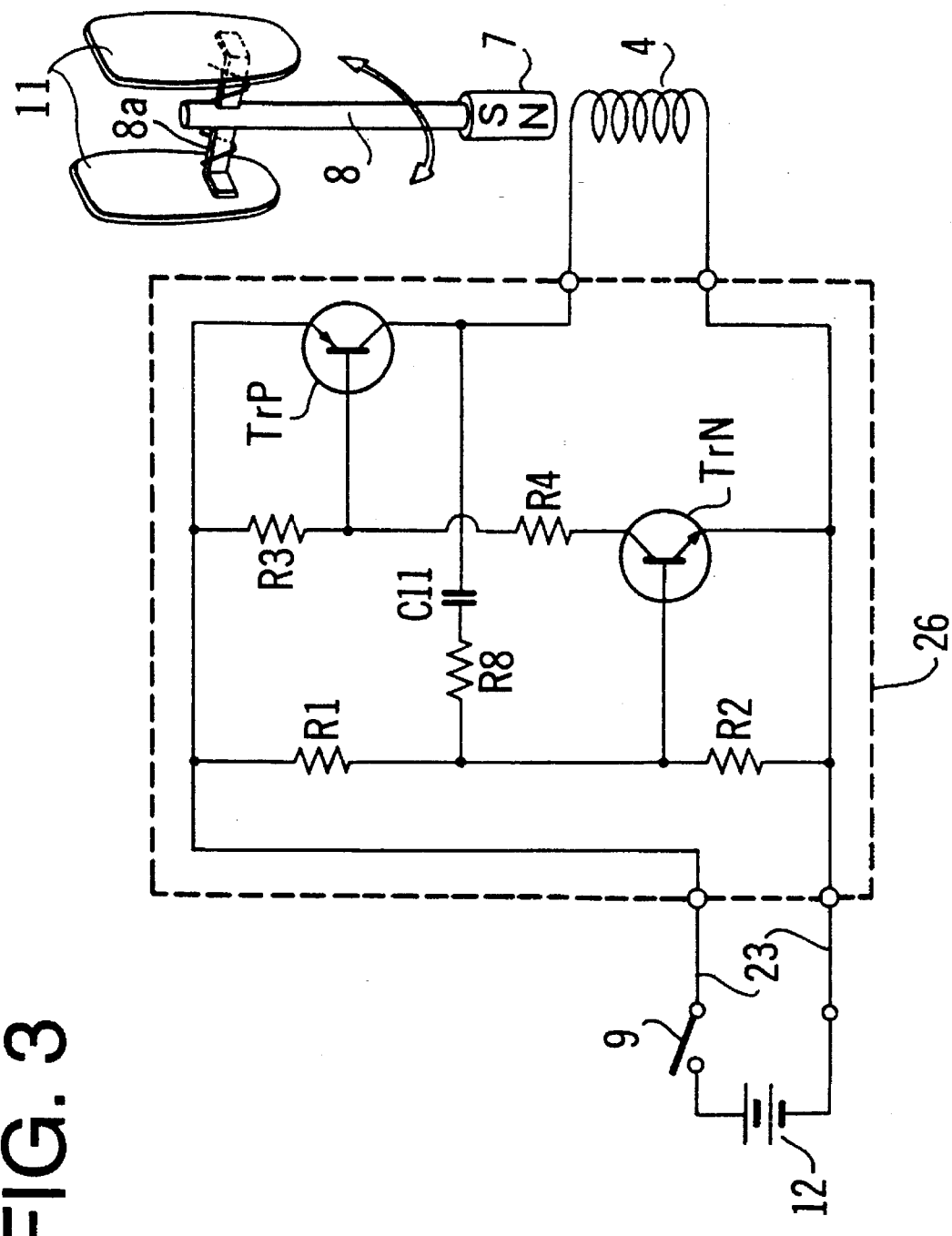
FIG. 3 is a connection diagram with a perspective view of a pendulum according to a first embodiment of the present invention.

The following description is now provided about a driving apparatus for a signboard having swinging design panels as part of the signboard according to a first embodiment of the present invention. As shown in FIG. 3, a driving coil 4 is fixed within a signboard installed in high position difficult to make maintenance, and a permanent magnet 7 opposed to the upper surface of the driving coil through a slight gap is attached to the lower end of a pendulum 8 which is fixed to a middle part of a horizontal pendulum shaft 8a and is depending by gravity, both ends of the horizontal pendulum shaft 8a projecting from bearing openings formed in both right and left side faces of the signboard.

Design panels 11 each with a face drawn thereon are attached to both ends of the horizontal pendulum shaft 8a and thus the right and left sides of the signboard each have a portion wherein the face swings with swing motion of the pendulum 8.

On the other hand, a circuit component group 26 with printed circuit board is incorporated in the signboard, and the driving coil 4 is connected to this oscillation circuit as a load thereon. As a power source of this circuit, a DC power source 12 of 3 volts comprising two dry cells is disposed in a position where the maintenance of battery replacement is easy. The DC power source 12 is connected to a power source operating switch 9 through a lead wire 23.

When the electric current from the DC power source 12 is applied to the circuit by operating the switch 9, a magnetic pole of the same polarity as that of the permanent magnet 7 opposed to the upper surface of the driving coil 4 is generated by the foregoing operation of the circuit, causing the permanent magnet 7 to be accelerated repulsively, whereby the swing motion of the pendulum 8 can be started together with the design panels 11.

The operation of this embodiment will be described below.

When the driving coil 4 and the permanent magnet 7 are opposed to each other through a slight gap and the permanent magnet 7 lies at the lower end of the swing side (the lower end of the pendulum), in other words, when the driving coil lies near a neutral point of the swing motion of the permanent magnet whose moving direction is restricted by the pendulum, if the supply voltage from the DC power source 12 is applied to the semi-free-running oscillation circuit comprising two transistors by operating the switch 9, a collector current amplified by a slight base current passing through a resistor R1 flows through an NPN transistor TrN, and a PNP transistor TrP whose base is connected to the collector of the transistor TrN also turns ON, allowing the collector current to flow therein. At this time, a portion of the collector current in the transistor TrP flows through a resistor R8 as a charging current for a capacitor C11 which is for setting a timer time constant. Since this charging current flows as a base current in the transistor TrN, both transistors are turned ON instantaneously by a positive feedback action.

With the charging current to the capacitor C11, the terminal voltage of the same capacitor begins to rise rapidly, and with decrease of the charging current, the voltage imposed on the resistors R8 and R2 decreases. Both transistors are kept ON for a short period of time until the terminal voltage of the resistor R2, namely the base voltage of the transistor TrN, drops to a level of 0.55 V or lower, allowing an electric current to flow through the driving coil 4. After that short time (for example, 0.6 second or so though the set value varies depending on the pendulum size and weight), both transistors turn OFF.

This is because the base current decreases or almost disappears at a transistor TrN base voltage of 0.55 V or lower so the transistor TrN turns OFF and the transistor TrP also turns OFF since there is no supply of base current for positive feedback instantaneously.

Next, the electric charge in the capacitor C11 passes through the driving coil 4 and is discharged through the resistor R1 of a high resistance value from the power source 12, so that the terminal voltage of the capacitor C11 drops gradually. At this time, the base voltage of the transistor TrN is applied initially as a reverse base voltage, and thereafter, until a forward base voltage is applied to the capacitor C11 up to near 0.6 V, the two transistors are kept OFF. A base voltage of 0.56 V on the average is required as a voltage for the activation of transistor, but in the present invention it is expressed as a voltage near 0.6 V, although such voltage varies depending on the ambient temperature.

The configuration of this free-running oscillation circuit is as illustrated in FIG. 3 and the foregoing electric operation at the time of start-up is well known. If only the driving coil 4 is present and the permanent magnet 7 absent, this circuit repeats the foregoing operation at certain cycle and frequency under the electric operation.

However, in the invention wherein magnetic poles of the same polarity are arranged, there is used the permanent magnet 7 capable of making a relative movement with respect to the driving coil 4, so when an electric current is fed to the driving coil 4 for a short time under the foregoing operation in a stationary state of the pendulum, a magnetic field of the same polarity as that of the permanent magnet 7 is created on the driving coil, so that a repulsive electromagnetic force is generated between the permanent magnet 7 and the driving coil 4 opposed thereto through a slight gap. With this electromagnetic force, the position of the permanent magnet at the lower end of the pendulum 8 shifts from the neutral point in the direction such that the initial slight eccentricity is enlarged of the swing motion and the pendulum 8 starts its inertial swing motion while returning under a gravitational restoring force. In the present invention, a force other than gravity is also employable as the restoring force of the swing motion.

The subsequent operation of the circuit varies depending on the state of motion of the permanent magnet 7. When the permanent magnet has returned to the neutral point of the swing motion, a relative moving speed of the driving coil and the permanent magnet becomes maximum and an electromotive force generated in the driving coil also becomes maximum. In this state, a shift is made to the operation as a semi-free-running oscillation circuit not affording a certain constant cycle. This point will be explained below with reference to FIGS. 4 and 5.

In a conventional pendulum driving apparatus for an interior accessory such as a clocks the swing motion of a pendulum is started and a driving coil is energized twice to cause the coil and a permanent magnet to face each other during one reciprocation of the pendulum, so it suffices to supply only a very small amount of a driving coil current for supplementing the energy which is lost during half of the reciprocation of the pendulum. On the other hand, in the present invention it is necessary that an electric current sufficient to start the swing motion of the pendulum be flowed in the driving coil 4 by the foregoing operation even for a short period of time.

If such supply of a relatively large current for a short time is repeated every time the permanent magnet returns towards the driving coil as in the conventional pendulum driving apparatus, the energy will become too much and the swing motion of the pendulum will exceed the required amplitude, resulting in that the swing motion becomes unnatural and strikes against something. In the present invention, such inconvenience is overcome by providing a long unenergized period so that electric power is supplied at a rate of one per two to ten reciprocations of the pendulum swing motion according to magnitude of loss caused by bearing or load.

Figure 4A:
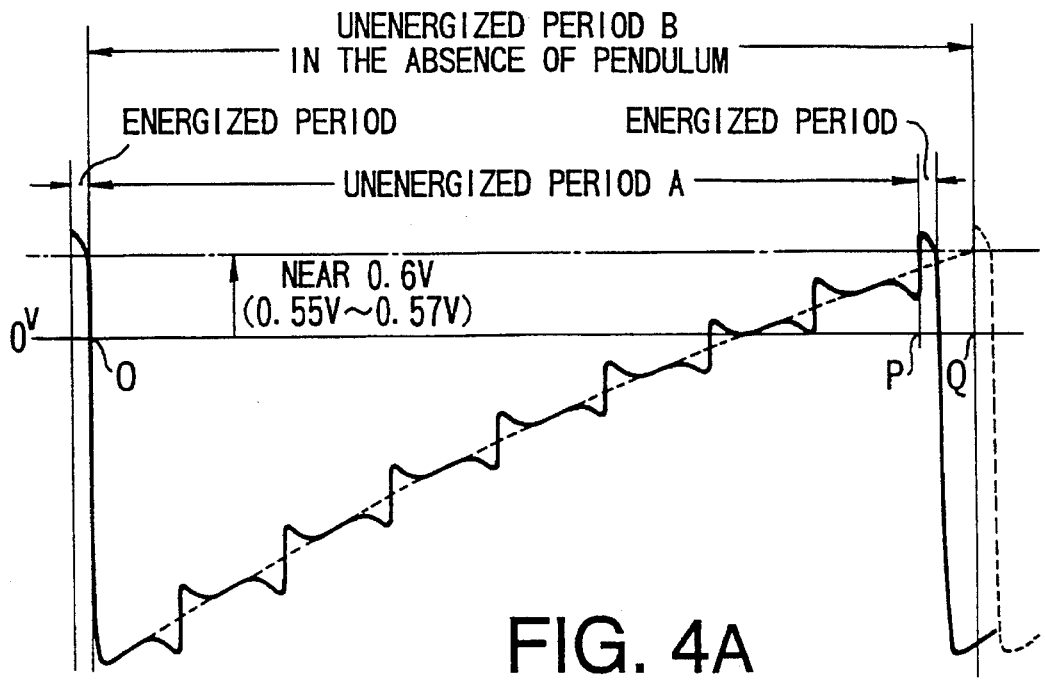
FIG. 4(A) is a graph showing changes in the base voltage of a transistor TrN illustrated in FIG. 3 in the first embodiment, in relation to time.

As an example for explanation, the graph of FIG. 4(A) shows changes in the base voltage of the transistor TrN which conducts current at a rate of one per four reciprocations of the swing motion after start-up of the pendulum motion.

In the same figure, a base voltage curve indicated as a solid-line curve in unenergized period A from an energization end time-point 0 up to an energization start time-point P represents changes in the base voltage during the period in which the permanent magnet 7 passes above the driving coil 4 seven times in the swing motion of the pendulum 8.

The dotted-line curve in the same figure represent changes in the base voltage in the absence of both pendulum and permanent magnet 7, and it is indicated as unenergized period B.

In this case, the permanent magnet 7 passes above the driving coil 4 twice during one reciprocation of the pendulum 8, so during four reciprocations of the swing motion of the pendulum, the permanent magnet 7 and the driving coil 4 face each other eight times. In the seven oppositions except the initial one opposition wherein electric power is supplied, no current is conducted and this period is set as unenergized period A in which there is performed a damping inertial swing motion of the pendulum 8.

As also noted above in the description of operation, at the time of start-up of the pendulum, if the permanent magnet is not present above the driving coil, voltage starts from a reverse base voltage of a voltage substrated 0.7 V or so from the supply voltage, indicated on the minus side on which the voltage is a reverse voltage for the base of the transistor TrN, as indicated by the dotted line in the graph, due to the terminal voltage charged in the capacitor C11 for setting a timer time constant, then as the capacitor C11 is discharged gradually through the resistor R1, the base voltage gradually becomes 0 V as indicated by the dotted-line curve of base voltage. Thereafter, by reverse charging from the power source to the capacitor C11, the base voltage of the transistor TrN rises as a forward base voltage smoothly up to a level near 0.6 V indicated on the plus side, whereupon a base current flows in the transistor TrN and the driving coil 4 ought to be energized at the time point Q in the figure under the foregoing action.

In the present invention, however, the pendulum 8 has already started its swing motion, the permanent magnet 7 moves relatively above the driving coil 4, an induced electromotive force is generated in the driving coil and this voltage exerts an influence on the base voltage of transistor TrN through the capacitor C11 for setting a time constant, so the supply of electricity is not always started at the foregoing time point Q.

Figure 4B:
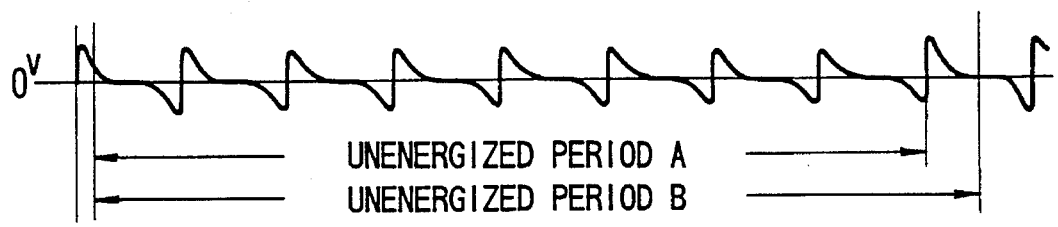
FIG. 4(B) is a graph showing changes in voltage induced in a driving coil with swing motion of a permanent magnet illustrated in FIG. 3 in the first embodiment, also in relation to time.

The voltage thus generated in the driving coil 4 by the movement of the permanent magnet 7 is shown in the graph of FIG. 4(B) in which a forward voltage of the base voltage is indicated as plus.

As shown in the graph (B), the induced electromotive force becomes minus just before the permanent magnet 7 arrives at the position just above the center of the driving coil 4, and it becomes plus when the permanent magnet 7 leaves the said position. As the permanent magnet moves away from the driving coil 4, the induced electromotive force approaches zero.

An induced electromotive force obtained by combining the generated voltage (B) in the driving coil 4 with the base voltage in the unenergized period B indicated by the dotted line corresponds to a change curve in the unenergized period A up to time point P indicated by the solid line in the graph (A) of FIG. 4.

The time point P in this graph is an instant at which the permanent 7 tries to leave the position just above the driving coil 4. When the induced electromotive force in the driving coil 4 forces up the base voltage of the transistor TrN, the supply of electricity is started earlier than the energization starting time point Q which is in the absence of the permanent magnet 7. Thus, by a short-time supply of electric power to the driving coil 4.it is made possible to drive the permanent magnet 7 repulsively at the most efficient timing and thereby accelerate the swing motion.

If the driving coil 4 is energized at the time point Q later than the time point P, there ought to be only a weak electromagnetic force or no driving force after the permanent magnet has moved away from the driving coil.

Figure 5:
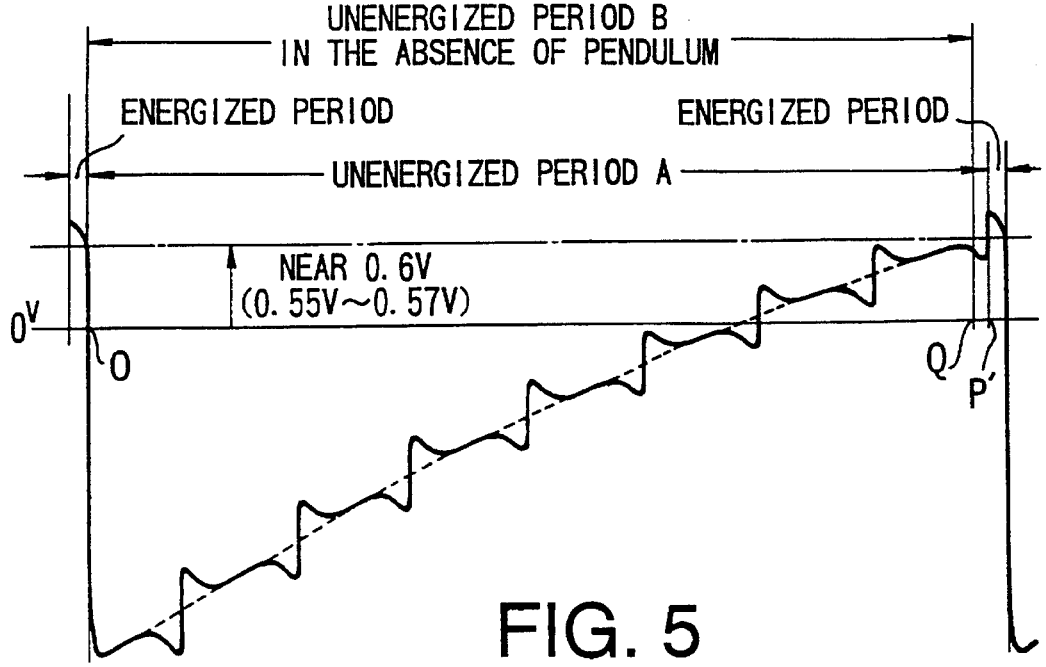
FIG. 5 is a graph showing changes in the base voltage of the transistor TrN in FIG. 3 in relation to time and in a pendulum swing cycle different from that in FIG. 4.
Figure 6:
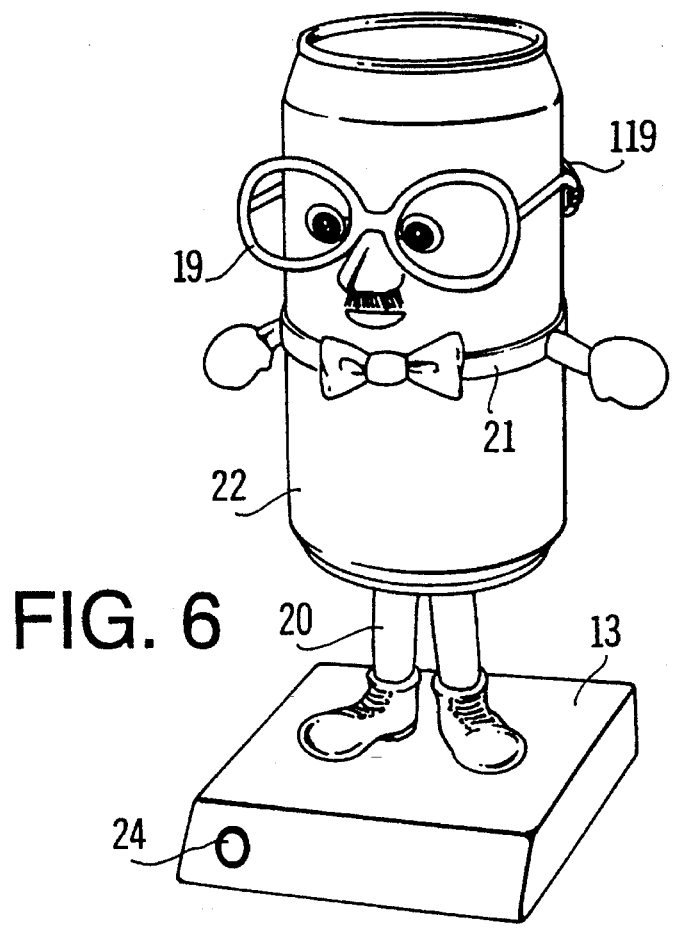
FIG. 6 is a perspective view of a second embodiment of the present invention.

Further, as shown in FIG. 5, in the case where the pendulum cycle changes by some cause or other and the permanent magnet 7 is about to enter the position just above the driving coil 4 at the time point Q at which the supply of electricity ought to be started in the absence of the permanent magnet, then if the driving coil 4 is energized in such a condition, the permanent magnet 7 will decelerate under a repulsive force from the driving coil 4, resulting in that the motion of the pendulum ought to be weakened or stopped.

In the present invention, however, the position and moving direction of the permanent magnet 7 which makes a relative movement with respect to the driving coil 4 are detected using a voltage generated in the driving coil by the movement of the permanent magnet 7, and the supply of electricity is stopped during the foregoing worst period in which the swing motion is decelerated, then the energizing time point is delayed up to time point $P_1$ behind the time point Q, to accelerate the swing motion.

This is because when the permanent magnet is about to enter the position just above the driving coil 4, the generated voltage in the driving coil acts to force down the forward base voltage of the transistor TrN, and the time point Q at which in the case of a mere free-running oscillation circuit the base voltage thereof rises inevitably to near 0.6 V and turns ON the two transistors, is avoided, thereafter the supply of electricity to the driving coil can be delayed up to the time point $P_1$ which is an instant of arrival of the permanent magnet 7 at the position just above the driving coil 4.

Thus, the apparatus of the present invention is a pendulum driving apparatus involving a relative movement of the driving coil and the permanent magnet. According to this apparatus, for self-starting, the driving coil is energized for a short time using sufficient electric energy by means of the free-running oscillation circuit, then during operation after start-up of the pendulum, the energy (position energy or flexible elastic energy in the case of using a spring as restoring force) which has been lost during plural reciprocating swing motions of the pendulum is supplemented by the supply of electric power to the driving coil for a short time through the semi-free-running oscillation circuit wherein the cycle and frequency of the pendulum swing motion vary in accordance with the confronting timing of the permanent magnet and the driving coil, thereby permitting the pendulum to perform a continuous swing motion even though there may be amplitude variations.

Next, in connection with the invention wherein magnetic poles of the same polarity are arranged, the following description is now provided about the operation of the invention adopting means for attaining high efficiency which means is added to part of the electronic circuit.

This means uses a diode D1 shown in the connection diagrams of FIGS. 7 and 11 which will be referred to later in the explanation of embodiment. The diode D1, driving coil 4, capacitor C11 for setting a time constant and base-to-emitter resistor R2 of the transistor TrN are connected in series. Since a rectifying energization direction of the diode D1 is set to a direction in which electric power is supplied upon application of a forward base voltage of the transistor TrN of 0.5 V or more, the discharge current of the capacitor C11 flowing through the driving coil 4 which ought to flow in the resistor R2 is blocked by the foregoing reverse base voltage component of the transistor TrN of the AC voltage generated in the driving coil by movement of the permanent magnet 7.

Generally, a relative traverse of magnetic lines of force of a permanent magnet with respect to a coil required for power generation undergoes a damping force according to the magnitude of a load current which is determined by the magnitude of a resistance value of a load resistor in a circuit connected in series with the coil. But according to the use of means having high efficiency, the damping force exerted between the driving coil and the permanent magnet can be eliminated by blocking a generated current which ought to pass through the resistor R2 during a transistor OFF period until rising of the base voltage of the transistor TrN from the reverse voltage up to a forward voltage near 0.6 V. It is not until the base voltage of the transistor TrN reaches a level near 0.6 V that the generated current in the driving coil flows through the resistor R2 and the transistor as a base current thereof. Thus, it is possible to flow a driving coil current which brings about a driving force sufficiently larger than the resulting damping force, and hence it is possible to effect the swing motion at a high efficiency.

Unlike the conventional diode for protecting SCR gate reverse voltage connected in series with the detecting coil, the diode in question is not for the protection of transistor. In the case where electromotive force is generated several times in the driving coil in a relative relation to the permanent magnet and in the absence of a driving force during several swing motions of the pendulum as in the present invention, the prevention of such generated current from flowing permits minimizing the decrease in amplitude of the pendulum and saving of the driving coil current which compensates for the decrease of the amplitude.

A second embodiment of the present invention which is practised as a toy or a dancing doll for advertising will be described below.

This embodiment relates to an energy-saving toy which permits a remarkably prolonged working period of UM-4 dry cells accommodated within a base 13 and which is also applicable for POP advertising or as a premium.

In this toy, an aluminum can 22 for canned beer for example is utilized as the body and head of the toy. A permanent magnet 7 which emits magnetic lines of force downward and a yoke iron plate 7a are fixed to the center of the upper surface of the doll head portions while a ring-shaped weight 14 and a cylindrical frame 15 having a flange portion at the lower end thereof are fixed the peripheral surface of the lower portion of the doll body. Further, a cantilever 15b is projected toward the center of the body from one side of the upper portion of the cylindrical frame 15, and a pivot shaft 16 is fixed downward to the lower portion of the cantilever 15b.

On the other hand, an upright, die-cast aluminum frame 17 having two legs is erected on the base 13, and on the upper end thereof is disposed a driving coil 4 in an opposed relation through a slight gap to the permanent magnet 7 attached to the head of the doll. Further, a pivot bearing 18 made of hardened steel is fixed to the upright frame 17 in a position near the central part of the doll body, and a sharp tip of the pivot shaft 16 on the doll side is put on the pivot bearing.

One design feature of this doll resides in eye-glasses 19 with eyes, nose and mouth, which eye-glasses is attached to the aluminum can 22 by utilizing the elastic force of an elastic string 119. Another feature resides in a ribbon 21 with a bow tie and hands, providing a meaning of design indicating a boundary between the head and the body. The ribbon 21 is constituted by a rib stitch ribbon or an adhesive tape with prints so that it can be wound round the aluminum can easily.

Electric wiring of this embodiment will now be described. Two lead wires 123 extend from the driving coil 4 downward along the upright frame 17 and is inserted along one leg into the base 13. The lead wires 123 and the leg portions of the upright frame 17 are covered with a plastic leg cover 20.

Figure 7:
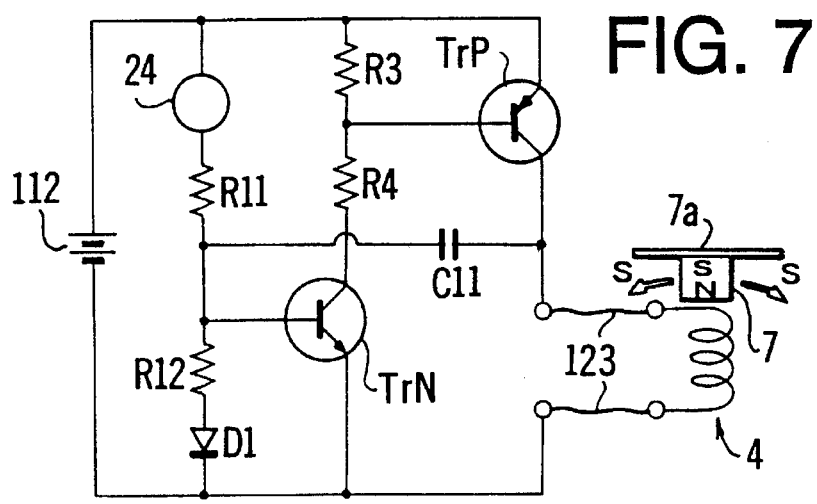
FIG. 7 is a connection diagram with a relative relation diagram of a permanent magnet and a driving coil both illustrated in FIGS. 9 and 10 in the second embodiment.
Figure 8:
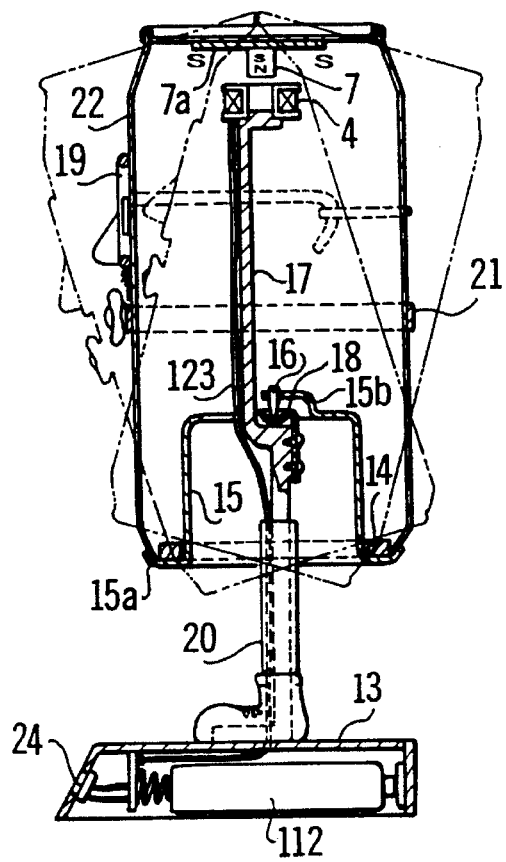
FIG. 8 is a vertically sectional side view of the second embodiment.
Figure 9:
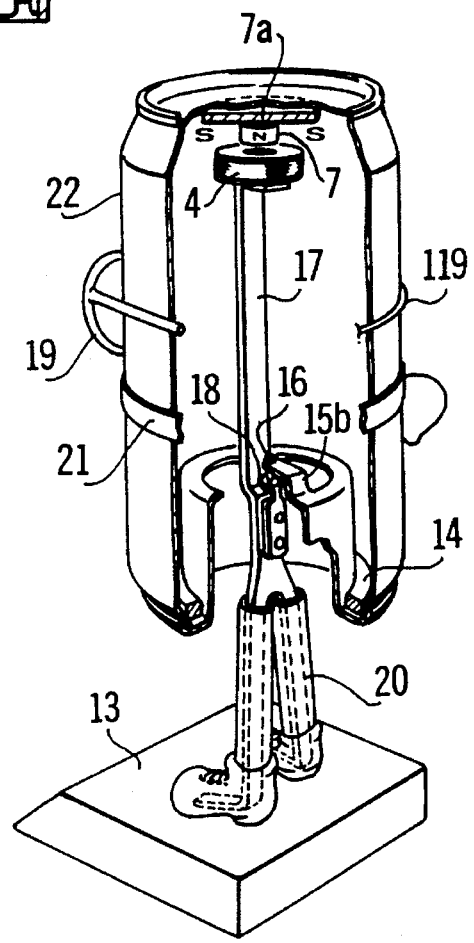
FIG. 9 is a partially cut-away perspective view of the second embodiment.

The lead wires 123 of the driving coil 4 thus inserted into the base 13 are connected as shown in the connection diagram of FIG. 7.

A semi-free-running oscillation circuit used in this embodiment is characteristic in that a resistor R4 is inserted between the collector of an NPN transistor TrN and the base of a PNP transistor TrP to restrict a waste base current flowing more than necessary in the transistor TrP and that a CdS photoconductor 24 is connected from the base of the NPN transistor TrN to the plus side of dry cells 112 in series with a resistor R11.

No switch is used in this embodiment, so when the motion of the doll is to be stopped, a black tape or a light shielding plate is applied onto the CdS photoconductor 24 which is exposed on the front side of the base 13. As long as the interior of the room where the doll is placed is light and the CdS photoconductor 24 is not shielded from light, the doll continues to present a dancing motion as an interior accessory.

Since the operation time of this interior accessory is long unlike the toy, measures are taken for minimizing the power consumption of the two UM-4 dry cells 112 incorporated therein and for realizing a vigorous motion. As one measure, a germanium diode D1 is connected between the base and the emitter of the transistor TrN in series with a resistor R12. With this diode D1, the electric current generated by movement of the permanent magnet 7 is prevented from flowing in the driving coil 4 while the driving current is not flowed in the driving coil, to eliminate a damping force for the power generation exerted on the permanent magnet 7 (although there is a slight generated current passing through the resistor R12 and the diode D1 as the base voltage of the transistor TrN approaches 0.6 V, it is small to a negligible extent for the said damping force), thereby keeping small the rate of decrease in amplitude of the doll swing motion, diminishing the driving coil current as additional energy and prolonging the dry cell life.

Another measured adopted for minimizing the power consumption and realizing a vigorous operation is to stop the free-running oscillation of the circuit automatically as the interior of the room gets dark at night so that the dry cells are substantially not used. This operation will be described below. There will be described another countermeasure to reduce a current to be consumed As the interior of the room grows light, the resistance value of the photoconductor 24 which has been 1500 kΩ or so in the dark state becomes 40 kΩ or so under an illuminance of 1 lux, and when the supply voltage of 3 V is divided using the total resistance value of 200 kΩ of the said 40 kΩ and 160 kΩ of the resistor R11 as well as the resistance value of the resistor R12, the voltage of the resistor R12 plus a forward voltage of about 0.1 V of the diode D1 corresponding to a germanium diode or shottky barrier diode which has less forward voltage drop is applied as a base-to-emitter voltage of the transistor TrN. Then, when this voltage reaches a level near 0.6 V, an intermittent supply of electric power to the driving coil 4 begins under the foregoing operation.

Consequently, by virtue of an electromagnetic force exerted between the permanent magnet 7 attached to the doll head and the driving coil 4 thus energized, the doll continues to swing like dancing tiltably in any direction with the center of the body or a nearby position as the central point of rotation, that is, like dancing while turning in various directions, while the tip of the pivot shaft 16 is supported pivotably by the pivot bearing 18 fixed to the upright frame 17. The motions indicated by arrows or dash-double dot lines in the drawing represent a portion of the swinging state of the doll and actually the doll performs complicated motions as combinations thereof.

The reference numeral 7a in the drawing denotes a yoke iron plate with the permanent magnet 7 fixed centrally to its underside. The yoke iron plate 7a is disposed so that the whole of its underside serves as S pole, to increase an electromagnetic driving force exerted between it and the driving coil 4.

Figure 10:
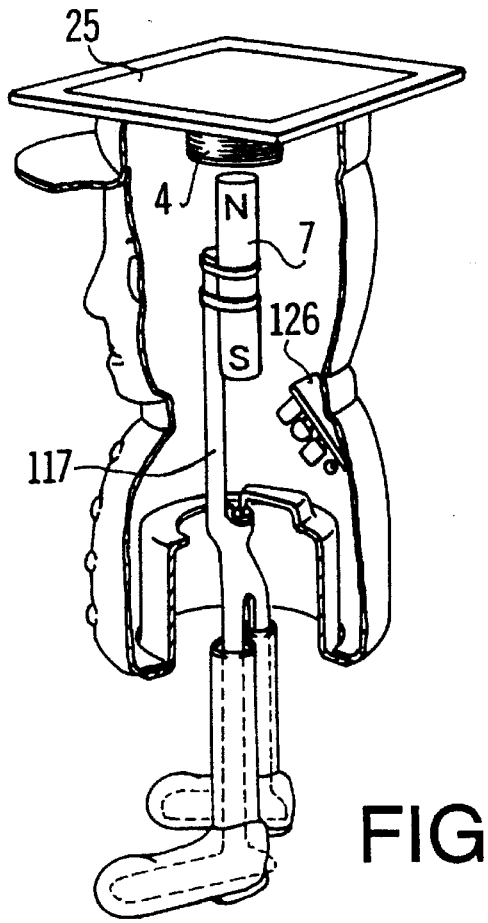
FIG. 10 is a partially cut-away perspective view of a third embodiment of the present invention.
Figure 11:
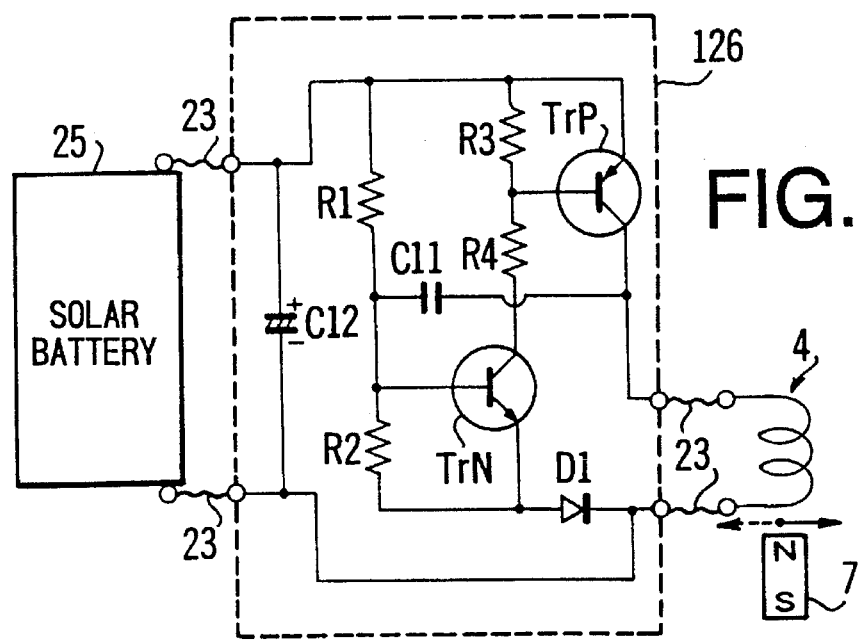
FIG. 11 is a connection diagram with a relative relation diagram of a permanent magnet and a driving coil both used in the third embodiment.

The following description is now provided about a toy according to a third embodiment of the present invention with reference to FIGS. 10 and 11. In this toy, as shown in those figures, a solar battery 25 of a low illuminance for interior use is disposed on the upper surface of a square college cap of a student-designed doll. A driving coil 4 connected to a circuit component group 126 with printed circuit board accommodated within the doll body is fixed to the central part of the underside of the solar battery 25, and a permanent magnet 7 fixed to the upper end of a vertical frame 117 which extends vertically upward via somewhat larger legs for stabilization is opposed to the underside of the driving coil 4 through a slight gap. As in the preceding embodiment, the entire body and upper portion of the doll are supported by the vertical frame 117 so as to be freely tiltable and horizontally rotatable at the center of the body interior.

FIG. 11 is a connection diagram of a semi-free-running oscillation circuit used in this embodiment. For saving of waste current, a resistor R4 is inserted between the collector of an NPN transistor TrN and the base of a PNP transistor TrP, and for the supply of electric power, a 470 µF electrolytic capacitor C12 for power supply and the solar battery 25 are connected in parallel. In the interior of the solar battery 25 are arranged plural cells in series connection, and a voltage of about 3 V and an output of 25 µA are obtained by a fluorescent lamp illumination of 200 lux or by an incandescent lamp illumination of 40 lux. The power capacitor C12 is charged with an electric current of 25 μA on the average during a substantially unenergized period of about 12 seconds, and an electric current of about 2 mA is flowed in the driving coil 4 at a pulse width of about 0.15 second which corresponds to about one eightieth of the said charging period, to generate an electromagnetic driving force between the driving coil and the permanent magnet 7.

As to the operation of the semi-free running oscillation circuit, it is as described previously so will not be referred to here, but a characteristic feature of this embodiment resides in that the driving coil 4 is located on the swinging doll side, while the permanent magnet 7 is on the stationary side at the top of the upright frame 117. This arrangement permits omission of a doll mount, and since the solar battery 25 and the circuit component group 126 with printed circuit board are disposed on swinging side, it is easy to effect wiring in the interior of the doll. Moreover, since an elongated and powerful Alnico magnet is employable as the permanent magnet 7, a sufficient electromagnetic driving force can be obtained even by a short-time energization of the driving coil 4. Further, for preventing the loss of energy caused by power generation in the circuit during the unenergization period for the driving coil 4, a diode D1 is inserted between the driving coil 4 and the emitter of the NPN transistor TrN, as shown in FIG. 11. Although the position of this diode D1 is different from that in the second embodiment described in connection with FIG. 7, there is only a slight difference in point of working voltage, and according to the construction of this embodiment (the same bearing structure as in the second embodiment), like that of the second embodiment, a generated electric current in the driving coil 4 passing through the resistor R2 which ought to be induced by a relative movement of the permanent magnet 7 and the driving coil during the unenergized period is blocked to eliminate the resulting damping force and thereby prevent the loss of mechanical energy of the bearing portion which supports the swing motion of the doll. Coupled with this construction, it is possible to minimize the decrease in amplitude of the doll swing motion during the unenergized period of the driving coil and create a continuous swing motion of the doll with only the interior illumination light.

As the environs of the apparatus grow light, the generated power in the solar battery becomes large and the charging of the electrolytic capacitor C12 for power supply proceeds. When the charged voltage has become large to a certain extent, the doll beings to swing. This operation has already been explained in connection with the operation of the present invention.

The present invention also permits the use of a silicon single crystal type solar battery for outdoor use. In this case, the apparatus of the invention can be utilized as a maintenance-free signboard swinging apparatus which gently moves without any radiation of direct sunlight direct thereto, and moves vigorously and conspicuously upon radiation of the sunlight directly thereto.

However the self-starting swinging apparatuses according to the first embodiment are pendulums with comparatively small displays. Therefore, these result in reduction of starting amplitude due to inertia force of mass and large size of a heavy swinging portion with respect to movement amount to be given by the initial one pulse to the coil for self-starting. As a result, the relative shifting velocity of the permanent magnet and driving coil is made slight and there is made slight the induced electromotive force caused by the above electromagnetic force and thereby stopping the movement o the pendulum without accelerating and swinging the pendulum. If self-started, it has become a self-running frequency of one (numerator)/integer (denominator) to the coherent frequency of the pendulum. Even if the amplitude is small and the induced electromotive force is small, it can be energized when the relationship between the permanent magnet and the driving coil is opportune for swinging of the pendulum. However, it was difficult to change resistance of the circuit and adjust the self-running oscillation frequency in accordance with oscillation frequency of various swinging portions such as signboard.

Therefore, the above problem can be overcome by making the initial one pulse of the driving coil current larger than that of normal operation. Hereinafter there will be described such embodiments.

Description is now directed to the operation of the solar battery utilizing circuit. The configuration of this circuit is the same as that of the principal portion of the previous embodiment except its power supply portion, with a mere difference being recognized in resistance values of resistors and capacitance values. Since the power source used in this circuit comprises the solar battery and the electrolytic capacitor C12 connected in parallel with each other, there occur changes in the supply voltage different from that in the operations wherein magnetic poles of the same polarity are arranged and those of the different polarity are arranged and hence there arises a difference in point of electrical operation at the time of driving the pendulum, which difference will be explained below with reference to FIGS. 10, 11 and 12.

As the environs of the apparatus grows light gradually, a voltage is induced in the solar battery and a slight charging current flows in the power capacitor C12 which is directly connected to both plus and minus terminals of the solar battery, resulting in that there slowly occurs a capacitor C12 voltage as the supply voltage in the semi-free running oscillation circuit like the DC power source in the foregoing main invention. At this time, the two transistors still remain OFF, so the charging current begins to flow in a time constant setting capacitor C11 and the voltage of the capacitor C11 rises gradually. Then, the base voltage of the NPN transistor TrN in FIG. 11 also rises to a level near 0.6 V and there flows a base current therein, so that the two transistors turn ON under the foregoing amplifying and positive feedback action.

However, unlike the DC power source 12 referred to in the foregoing description of operation, the solar battery supplies only a slight current in the unit of μA, so when the driving coil 4 is energized for a short time upon turning ON of the two transistors, the electric charge stored in the power capacitor C12 is released, thus reducing the capacitor C12 voltage. However, the voltage drop is 20% or so and there still remains 80% of voltage, though this differs depending on the capacitance of the power capacitor C12 or the resistance value of the driving coil. The capacitor C12 is charged with the slight current from the solar battery during an unenergized period based on the same action as that explained above in the operation of the main invention, to compensate for the voltage drop, and this is repeated. An average voltage of the capacitor C12 increases as the environs grow light, so that the discharge current to the driving coil 4 also increases. When the brightness reaches a predetermined illuminance, the electromagnetic force exerted on the permanent magnet 7 acts as a relative repulsive force with respect to the driving coil 4 necessary for start-up of the pendulum, thus causing self starting of the pendulum.

Figure 12A:
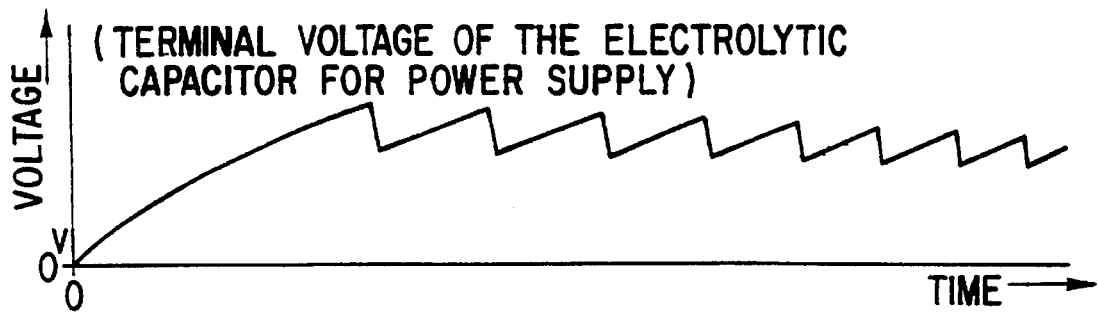
FIG. 12(A) is a graph showing changes in terminal voltage of an electrolytic capacitor for power supply in relation to time during increase of amplitude from self-starting in third and fourth embodiments of the present invention.
Figure 12B:
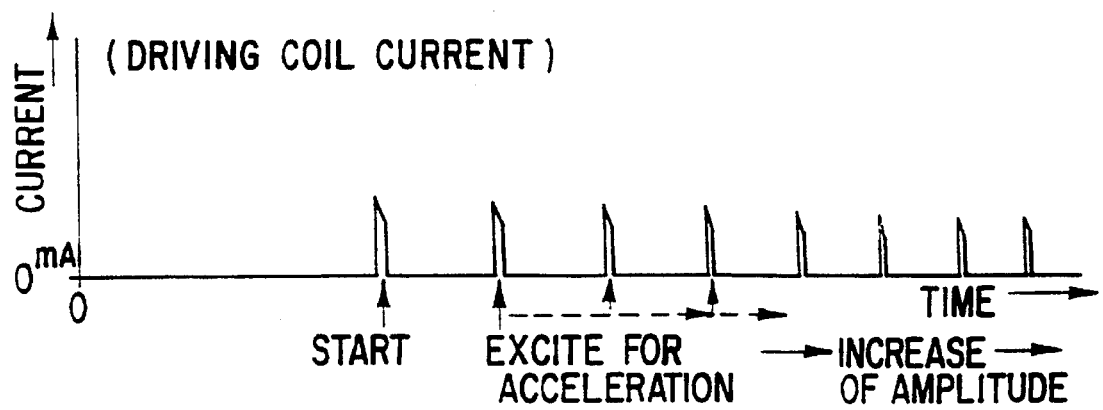
FIG. 12(B) is a graph showing changes of driving coil current also in relation to time during increase of amplitude from self-starting in third and fourth embodiments of the invention.

Further when an electric lamp is switched on in the dark at night to suddenly irradiate the solar battery with a light having more luminance than a given level, it is self-started by electrification of the driving coil at the initial turning-on of the two transistors as shown in FIG. 11, there varies as shown in FIG. 12A the voltage across the electrolytic capacitor C12 for the power supply so that the coil driving current flows as shown in FIG. 12B and thereby the amplitude becomes maximum after the driving coil becomes conductive several times. As a result, swinging can be maintained. In FIG. 12, the conductive period of the driving coil current is gradually shortened since the swinging speed is accelerated in accordance with increase of the induced electromotive force caused by increase of amplitude on the swinging side and thereby the circuit turns on because the induced electromotive force elevates the base voltage of NPN type transistor TrN in FIG. 11 before the period of the self-running oscillation circuit comes. In the graph of FIG. 12B, the driving current gradually decreases since the discharged current flows at a short conductive period before the electrolytic capacitor C12 is completely charged.

However, the pulse width and the current pulse are maximum and it can be self-started by such large amplitude that an effective induced electromotive force can be caused by the second pulse.

This is because the amount of electric current supplied to the solar battery is small and hence there occurs a short-time energization of the driving coil before the production of ample voltage in the power capacitor C12. As to the initial several times of supply of electricity to the driving coil from the power capacitor C12, as shown in graph 12B, the electromagnetic force in the initial stage is weak because of a small amount of electric current supplied to the driving coil, and there occurs only a slight oscillation and this oscillation stops before the next energization of the driving coil, or even if there slightly remains oscillation, it may be impossible to start operation because there is no effective power generation in the driving coil by the permanent magnet.

Thus, the slight current generated by the solar battery is stored in the electrolytic capacitor C12 for power supply to provide a power source of small internal resistances and after self-starting in accordance with the foregoing operation, the electric charge which has been stored little by little is flowed as a discharge current in the driving coil in the same manner as in the main invention and at a time point most efficient for acceleration of the swing motion, thereby creating a continuous swing motion of the pendulum.

The above operation compensates for the property of the solar battery incapable of instantaneously emitting a relatively large current because of a DC power source of a large internal resistance. But conversely, even when electric power is fed gradually to the power capacitor C12 by fabricating and using a DC power source of a large internal resistance, it is possible to attain the same pendulum swing motion.

According to this construction just mentioned above, in place of the combined construction of solar battery and the electrolytic capacitor for power supply, an arbitrary DC power source 12a or 12b such as, for example, a high ripple power source line one corresponding to half-wave rectification of AC or a power source including pulse wave, is connected to the power capacitor C12 through a resistor R5 of a high resistance value.

The operation of the apparatus using the AC power supply circuit will now be described. When an electric current is to be fed to the circuit from such power source by operating a switch, an electric current which has been limited to a slight current by the resistor R5 flows through the power capacitor C12, so that the voltage of the same capacitor rises gradually. Then, like the operation of the foregoing solar battery power source, the terminal voltage of the power capacitor C12 shown in FIG. 12 changes, as in the graph of FIG. 12(A) and there flows current in the driving coil 4 as in the graph of FIG. 12(B), After several times of energization, the pendulum is self-started and the amplitudes of the pendulum is added to bring about a continuous swing motion, The reason why in this case the power source portion has arbitrariness is that since electric current is fed little by little from the power source 12 to the electrolytic capacitor C12 via the resistor R5, the voltage of pulse format contained on the power source 12 side is attenuated in the resistor R5 and does not exert any bad influence on the semi-free-running oscillation circuit used in the main construction of the invention, In the present invention, erroneous energization caused by an external noise signal is prevented during the period other than the time point at which the electric current in the driving current 4 energizes the pendulum most efficiently.

Further, a noise signal caused by the driving coil current of pulse format and generated from the electronic circuit of the invention is absorbed by the electrolytic capacitor C12 for power supply, and further because of the presence of the high resistance value resistor R5, there is no fear of the noise signal being applied to other electronic apparatus using the arbitrary DC power source 12 as a shared power source.

Figure 13:
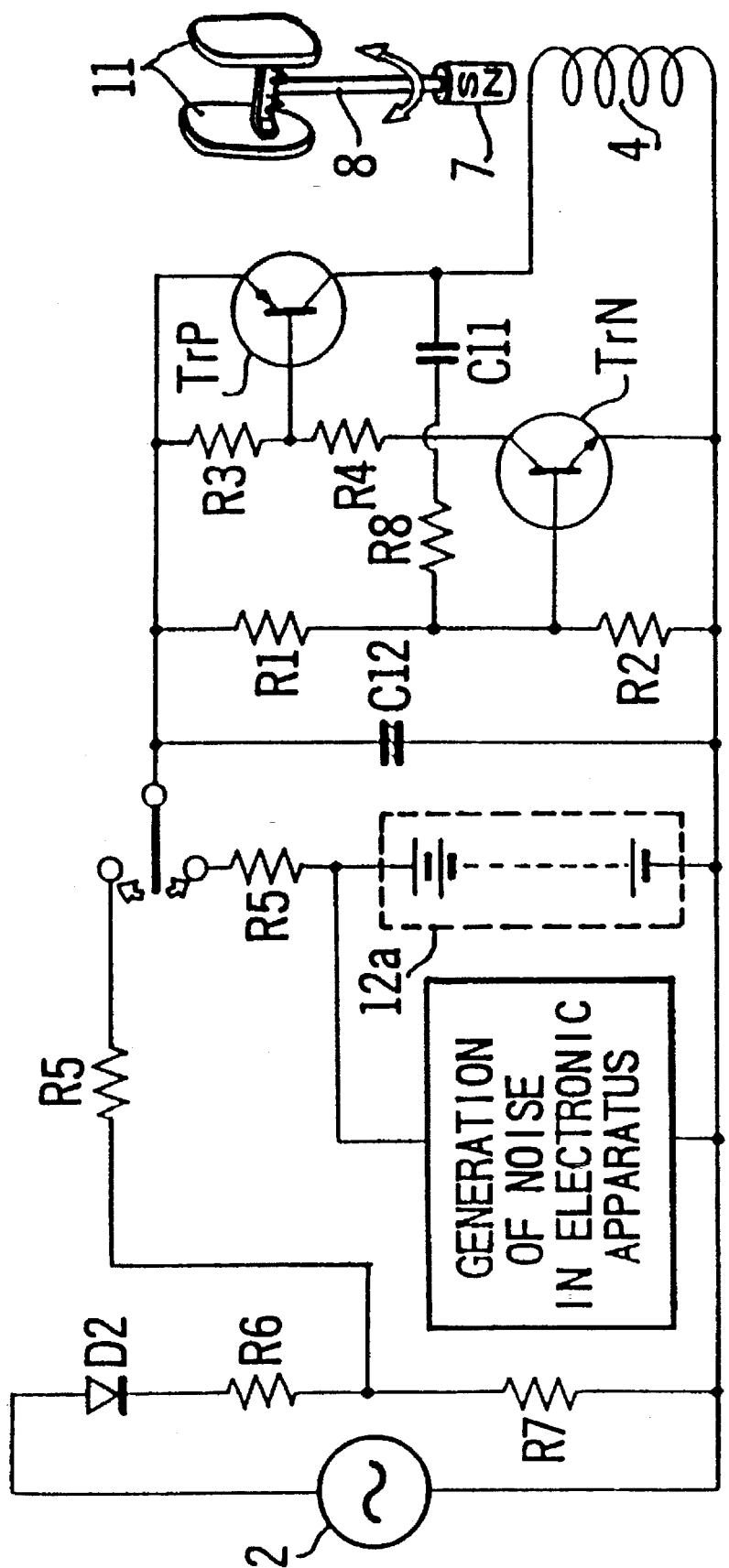
FIG. 13 is a connection diagram with a perspective view of a pendulum according to the fourth embodiment.

A fourth embodiment of the present invention will now be described with reference to the connection diagram of FIG. 13. The pendulum driving apparatus of this embodiment is of a relatively large output in which design panels 11 as a swinging portion constituting a part of a signboard are attached to a pendulum and which operates even in bad conditions such as windy condition for example. Where it is desired to make the apparatus changeable its installation place without cord, like a standing signboard, there is used a 12 V car battery 12a, while where the apparatus is to be installed in a place in which there already exists an AC power source of 100 V like a protruding signboard at the eaves, switching is made from that AC power source, indicated at 2, to a pulsating DC power source 12b comprising a diode D2 for half-wave rectification and voltage dividing resistors R6, R7.

Since this embodiment does not require saving of the power consumption, it is possible to operate the pendulum sufficiently vigorously. Even in the event the pendulum is stopped manually, it starts by itself, increases the amplitude thereof gradually and can revert to the original vigorous swing motion.

A characteristic feature of this embodiment resides in the power source portion used therein. More specifically, an electric current in a free-running oscillation circuit is supplied by discharge of an electrolytic capacitor C22 (2200 μF) of large capacitance for power supply, and an electric current is fed little by little as a charging current from the DC power source of the car battery 12a or the pulsating DC power source 12b to the capacitor C22 through the resistor R5 so as to compensate the voltage drop caused by that discharge.

According to such a power source construction, noise signals entering the power supply side from various electronic apparatus using the car battery 12a are attenuated in the resistor R5 and noise signals incoming from the AC power supply side are also attenuated in the resistor R5, to prevent the current in the driving coil 4 from being used in the period other than the driving period.

The electrolytic capacitor C22 of large capacitance for power supply is almost zero in its instantaneous internal resistance and the voltage thereof is relatively high, so upon turning ON of transistor, a peak value of an instantaneous charging current to a time setting capacitor C11 exceeds rated maximum currents of two transistors. Therefore, such charging current must be restricted and for this purpose there is used a resistor R8.

The reason why means for attaining high efficiency, using diode D1, is not adopted in this embodiment unlike the previous first and third embodiments is that a sufficient power source capacity is ensured so it is not necessary to save the power consumption and that since the resistance value of the resistor R2 is relatively high and the electric current generated in the driving coil is kept low, the loss of energy is slight.

Next, in connection with the invention relating to the arrangement of magnetic poles of different polarities, a fifth embodiment will be described below with reference to FIGS. 14 and 15.

Figure 14:
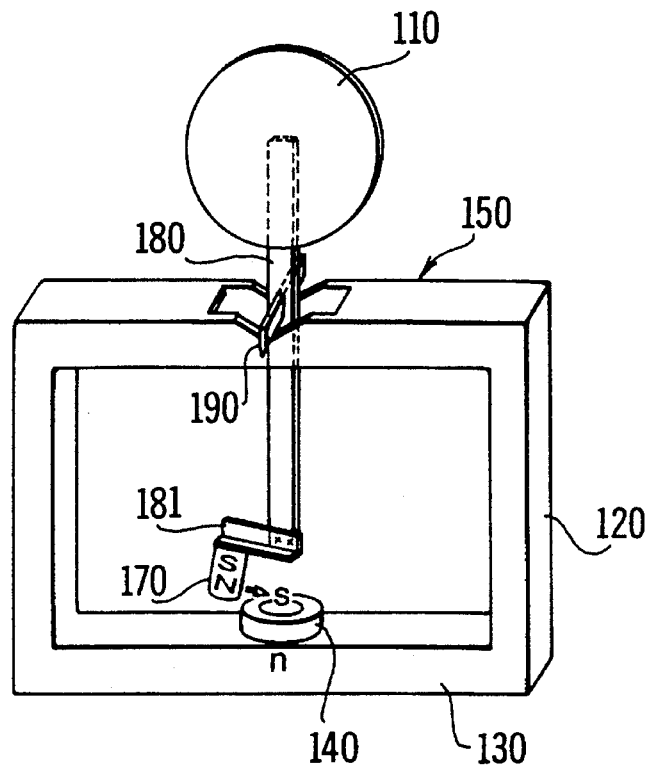
FIG. 14 is a perspective view of a fifth embodiment of the present invention.

When a pendulum 180 stands still, as shown in FIG. 14, an edge 190 of a knife edge disposed just above a gravity point of the pendulum is borne by a seat portion of a beam 150, and the beam 150 is supported and connected to a base frame 130 in a frame shape through right and left frames 120, to constitute a stationary-side frame 160. Further, a driving coil 140 is fixed to the upper surface of the base frame 130 in a position just under the pendulum 180. To the driving coil 140 is connected a free-running oscillation circuit (not shown) which is the same as that used in the first embodiment.

On the other hand, a design panel 110 is attached to the upper end of the pendulum 180, while to the lower end of the pendulum is attached a magnet mounting member 181 which extends leftward substantially at right angles to the longitudinal direction of the pendulum, and a permanent magnet 170 is fixed to the underside on one side of the magnet mounting member 181.

Figure 15:
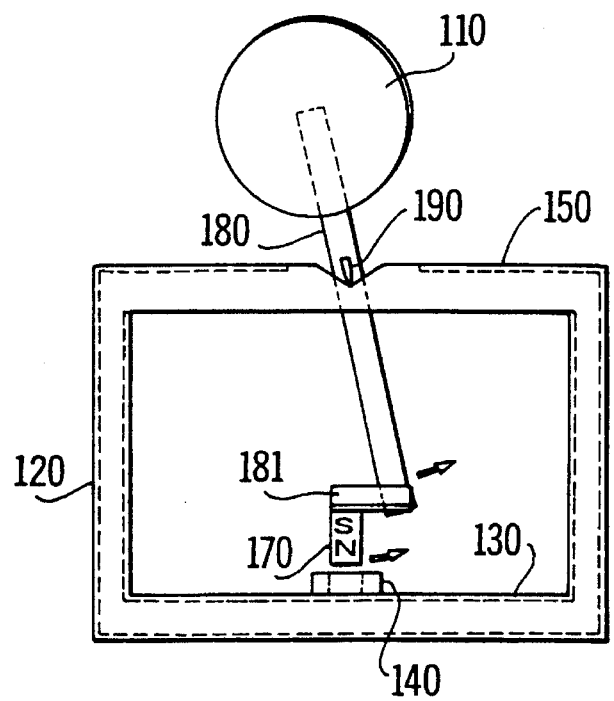
FIG. 15 is a front view of the fifth embodiment.

In such a positional state as in FIG. 14, when the driving coil 14 is energized for a short time by the circuit operation described previously, there is generated an s pole on the upper surface of the driving coil 140, as shown in the same figure, so that N pole positioned at the lower end of the permanent magnet 170 is attracted by the said s pole and the pendulum 180 moves as in FIG. 15. When the N pole at the lower end of the permanent magnet 170 comes into alignment with the central axis of the driving coil 140, if the supply of electric power to the driving coil 140 is stopped, it is possible to start a swing motion in the arrowed direction in the figure by virtue of inertia of the pendulum.

By setting the capacitance of the time constant setting capacitor relatively small, the energization time for the driving coil 140 can be set so as to eliminate the electromagnetic force exerted between the driving coil and the permanent magnet in a relatively early stage, thereby allowing the permanent magnet to pass the upper surface of the driving coil without resistance and permitting the pendulum to start a swing motion under inertial action. Even if the supply of electric power to the driving coil 140 is a little prolonged, the voltage generated in the driving coil when the N pole of the permanent magnet is about to leave the center of the driving coil serves as a reverse base voltage of the NPN transistor TrN in the circuit of the first embodiment to stop the base current of the same transistor and turn OFF the operation of the circuit, whereby the driving coil current acting to keep back the permanent magnet 170 leaving the driving coil is cut off and hence the braking force for the permanent magnet 170 can be kept to a minimum.

In the invention relating to the arrangement of magnetic poles of different polarities, the permanent magnet and the driving coil are disposed away from each other on the pendulum side and the stationary side, and upon energization of the driving coil under the foregoing operation of the circuit, an electromagnetic attractive force works on each of them, so that the permanent magnet and the driving coil move relative to each other to start a swing motion of the pendulum. In the case where the permanent magnet 170 is mounted on the pendulum side, if the means for moving the permanent magnet 170 is of a construction causing the moving means to pass the upper surface of the driving coil 14, then by determining the capacitance of the time constant setting capacitor C11 so as to stop the short-time energization of the driving coil just before the permanent magnet 170 faces the driving coil through a slight gap, it is made possible to eliminate the electromagnetic force exerted between the driving coil and the permanent magnet, allow the permanent magnet 170 to pass the upper surface of the coil and cause the pendulum to start its swing motion under an inertial action.

Although the amplitude of the swing motion after start-up is small initially, since the relative moving speed becomes maximum at the time when the permanent magnet 170 returns to the upper surface of the driving coil 140, the electromotive force of the driving coil 140 lying near a neutral point of the swing motion also becomes large to the extent of shifting a periodic energization time-point in the free-running oscillation circuit. In the case where the permanent magnet 170 is about to leave the upper surface of the driving coil 140 at the periodic energization time-point in the said circuit, the supply of electric power is stopped to prevent the generation of an electromagnetic force acting as a braking force, the start of energization is prolonged until return of the next swing motion and and until when the permanent magnet 170 tries to approach the driving coil 140, the swing motion is accelerated by an electromagnetic attraction between the permanent magnet and the driving coil induced by energization of the driving coil, the swing motion is continued by inertia until approaching the next periodic energization time-point in the free-running oscillation circuit, then a time-point which permits efficient swing motion is selected from among time-points before and after each of the periodic energization time-points in the free-running oscillation circuit which appear successively one after another, and the driving coil is energized to continue the swing motion.

In connection with the invention relating to the arrangement of magnetic poles of different polarities, a sixth embodiment will be described below with reference to FIGS. 16 and 17.

Figure 16:
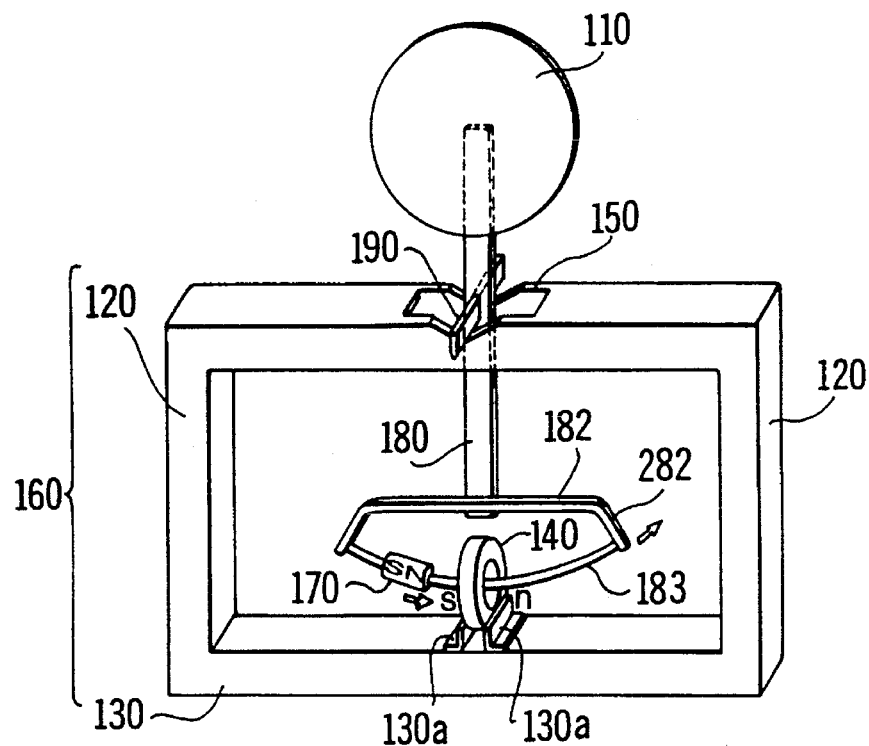
FIG. 16 is a perspective view of a sixth embodiment of the present invention.

According to this embodiment, when a pendulum 180 stands still, as shown in FIG. 16, an edge 190 of a knife edge disposed just above a gravity point of the pendulum is borne by a seat portion of a beam 150, and the beam 150 is supported and connected to a base frame 130 in a frame shape through right and left support frames 120, to constitute a stationary-side frame 160. Further, an annular air-core driving coil 140 is fixed to the upper surface of the base frame 130 in a position just under the pendulum 180 so that the annular faces thereof face right and left by means of a coil supporting member 130a. To the driving coil 140 is connected a free-running oscillation circuit (not shown) which is the same as that used in the first embodiment.

On the other hand, to the upper end of the pendulum 180 is attached a design panel 110, while to the lower end thereof is attached a mounting member 182 which extends right and left perpendicularly to the longitudinal direction of the pendulum. The mounting member 182 has both bent ends 282, and an arcuate member 183 made of a non-ferrous metal and having a radius corresponding to the distance from the rotational center of the pendulum is attached to both bent ends 282 while extending through the driving coil 140. Further, a permanent magnet 170 having S and N poles on the left and right sides, respectively, is fixed to the arcuate member 183 in a position biased from the center of the arcuate member.

Figure 17:
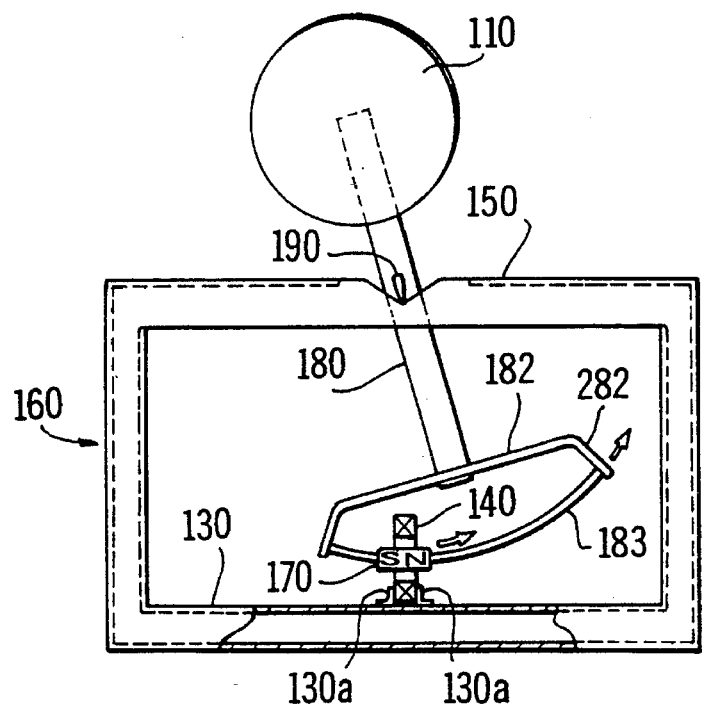
FIG. 17 is a partially cut-away front view of the sixth embodiment.

When the driving coil 140 is energized for a short time by the foregoing circuit operation in such a standstill state of the pendulum as in FIG. 16 which illustrates the above construction, an s pole is generated on the left-hand face of the driving coil, as shown in the same figure, so that N pole located at the rightmost end of the permanent magnet 170 is attracted to the s pole, thus causing movement of the pendulum 180 as in FIG. 17. If the supply of electric power to the annular driving coil 140 is stopped when a middle portion between S and N poles of the permanent magnet 170 has reached the center of the driving coil, a swing motion can be started in the arrowed direction in the figure by virtue of inertia of the pendulum.

By setting the capacitance of the time constant setting capacitor C11, the energization time for the driving coil 140 can be set so as to eliminate the electromagnetic force exerted between the driving coil and the permanent magnet in a relatively early stage, thereby allowing the permanent magnet to pass through the annular driving coil without resistance and permitting the pendulum to start a swing motion under the action of inertia. Even if the supply of electric power to the driving coil 140 is a little prolonged, the voltage generated in the driving coil when the N pole of the permanent magnet 170 is about to move further away from the right-hand face of the annular driving coil and the S pole thereof is about to enter the driving coil acts as a reverse base voltage of the NPN transistor TrN in the circuit of the first embodiment to stop the the base current of the same transistor and turn OFF the operation of the circuit, whereby the driving coil current acting to keep back the permanent magnet 170 leaving the driving coil is cut off and hence the braking force for the permanent magnet can be minimized.

If the invention relating to the arrangement of magnetic poles of different polarities is of a construction wherein the permanent magnet is attached to the pendulum side as in FIG. 16 and the means for moving the permanent magnet passes through the central hole of the driving coil, then by determining the capacitance of the time constant setting capacitor C11 so as to stop the short-time energization of the driving coil just before the permanent magnet is attracted to the driving coil and the middle part between both N and S poles of the permanent magnet passes through the center of the driving coil, it is made possible to eliminate the electromagnetic force exerted between the driving coil and the permanent magnet, allow the permanent magnet to pass through the annular driving coil and cause the pendulum to start its swing motion under the action of inertia.

In this case, if the annular driving coil mounted on the stationary side lies on the central axis of the pendulum while the pendulum stands still under its own weight, the permanent magnet is attached to the pendulum in a position deviated from the pendulum axis. In other words, if the central position of the permanent magnet in a standstill state of the pendulum under the action of a restoring force such as gravity is assumed to be a neutral point of the swing motion, the driving coil is mounted on the stationary side in a position deviated from the said neutral point.

This is because the permanent magnet is sucked into annular driving coil at the time of starting of the pendulum swing motion and thereby causes the pendulum to start its swing motion.

However, if the invention relating to the arrangement of magnetic poles of the same polarity is of a construction wherein the permanent magnet is mounted on the pendulum side and the permanent magnet moving means passes through the central hole of the annular driving coil, it is possible to minimize the foregoing deviation of the permanent magnet mounting position from the pendulum axis. (This point will be described in more detail later in a seventh embodiment.)

Thus, in the invention relating to the arrangement of magnetic poles of different polarities the permanent magnet and the driving coil are spaced from each other through a relative spacing which permits both to be relatively attracted with respect to each other when the driving coil is energized in a standstill stale of the pendulum, so the pendulum can be started its swing motion by itself by virtue of a relative electromagnetic attraction between the permanent magnet and the driving coil under the operation of the free-running oscillation circuit in the invention relating to the arrangement of magnetic poles of the same polarity.

After the start of the swing motion, the voltage generated in the driving coil with relative movement thereof with respect to the permanent magnet becomes reverse to that in the operation of the invention relating to the arrangement of magnetic poles of the same polarity shown in FIG. 5, and the permanent magnet and the driving coil try to approach each other, when there is generated an electromotive force which serves as a forward base voltage in the NPN transistor TrN, while when the permanent magnet is about to leave the driving coil, there is generated an electromotive force which serves as a reverse base voltage in that transistor. (This phenomenon occurs due to a polarity arrangement of the permanent magnet reverse to that wherein magnetic poles of the same polarity are arranged.) Therefore, by shifting the energizing cycle in the free-running oscillation circuit, selecting a time point at which the electromagnetic attraction between the permanent magnet and the driving coil is most efficient for the acceleration of the swing motion and energizing the driving coil at such time point, it is made possible to accelerate and continue the swing motion.

The reason why such optimal energization time selection in the circuit can be done irrespective of magnetic pole arrangement is that the driving coil 4 is connected as a power generation detecting means to the base of the front NPN transistor TrN in the free-running oscillation circuit and also connected to the driving current switch circuit constituted by the PNP transistor TrP in the output stage from the power source 12. The flowing direction (forward base current direction) of the electric current generated in the driving coil by a relative movement of the coil with respect to the permanent magnet and the output driving current direction are opposite to each other, so the time when there is the generated current in the forward base current direction corresponds to the time when the driving current to the driving coil 4 may be flowed, and thus it is possible to make the driving coil 4 play the role of a detecting coil.

In the present invention, it is optional whether each of the permanent magnet and the driving coil is to be disposed on the stationary side or the pendulum side, and even when the permanent magnet moving means referred to above in the explanation of operation is replaced with a driving coil moving means, there can be attained a self-starting action of the pendulum.

Figure 18:
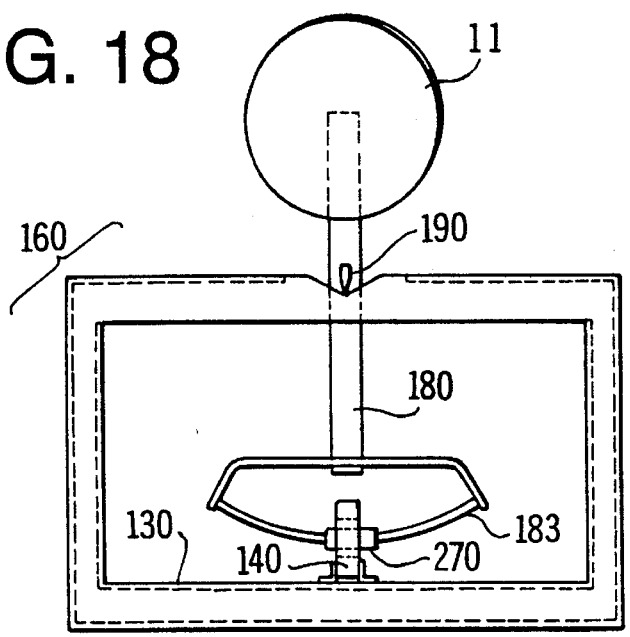
FIG. 18 is a front view of a seventh embodiment.
Figure 19:
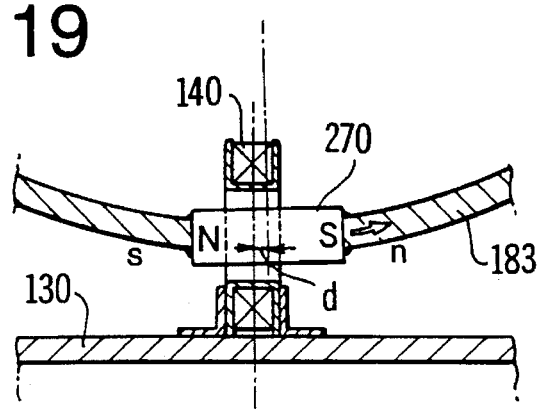
FIG. 19 is a partially cut-away, partially enlarged front view of the seventh embodiment.
Figure 20:
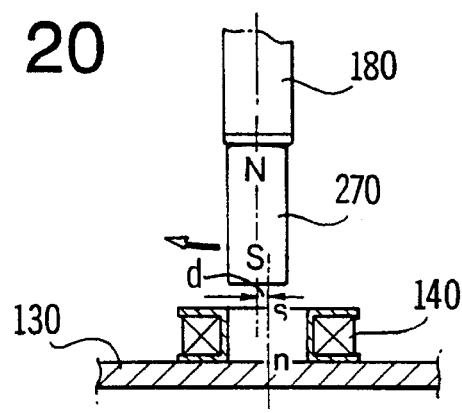
FIG. 20 is a partially cut-away, partially enlarged front view of an eighth embodiment of the present invention.

Next, in connection with the invention relating to the arrangement of magnetic poles of the same polarity, the following description is provided about a seventh embodiment illustrated in FIGS. 18 and 19 and an eighth embodiment illustrated in FIG. 20.

The seventh embodiment is of the same structure as the above sixth embodiment except a transverse position of a permanent magnet with respect to the driving coil in a standstill state of the pendulum and the arrangement of NS poles of the permanent magnet. FIG. 19 shows that, when the pendulum stands still, a central line between N and S poles located on the left and right sides, respectively, of a permanent magnet 270 is spaced by a distance d from a vertical center line of a driving air-core coil 140. When the driving coil 140 is energized, there is generated a magnetic field of magnetic poles indicated at s and n on magnetic axis at both left and right sides of the coil. As a result, the directions of s, n in the magnetic field and the directions of S, N of the permanent magnet 270 become opposite to each other, and the permanent magnet undergoes an electromagnetic repulsive force in the arrowed direction in the figure and is thereby accelerated and moves.

The starting direction is the direction in which the deviation d shown in the figure is present, and a relative position of the permanent magnet 270 with respect to the driving coil 140 in a standstill state of the pendulum which is determined by a centroid position of the pendulum is indicated by the slight deviation d. This deviation direction is the starting direction. If the pendulum is balanced in the transverse direction accurately without deviation so that the center of the permanent magnet in the transverse direction completely coincides with that of the driving coil in a standstill state of the pendulum, the permanent magnet 270 can move neither rightward nor leftward and the pendulum cannot start by itself. However, in the case where the pendulum bearing is a knife edge, it is impossible to stop or balance the pendulum to a perfect extent, so there is no problem in self-starting. If a bearing construction induces a frictional force, thus making it difficult to effect self-starting of the pendulum, a construction for avoiding this inconvenience is adopted by breaking the balance of the pendulum to provide the deviation d.

An eighth embodiment of the present invention will now be described with reference to FIG. 20. This embodiment is of the same structure as the foregoing fifth embodiment except a transverse position of a permanent magnet with respect to the driving coil in a standstill state of the pendulum and the arrangement of NS poles of the permanent magnet. FIG. 20 shows that, when the pendulum stands still, a central magnetic axis of both upper and lower N, S poles of a permanent magnet 270 is spaced from that of a driving air-core coil 140 by a distance d. When the driving coil 140 is energized, there is generated a magnetic field of magnetic poles indicated by s and n on magnetic axis at both upper and lower sides of the coil. As a result, the directions of s, n in the magnetic field and the directions of N, S of the permanent magnet 270 become opposite to each other, and the permanent magnet undergoes an electromagnetic repulsive force in the arrowed direction in the figure and is thereby accelerated and moves.

In this case, the starting direction is the direction in which the deviation d shown in the figure is present, and a relative position of the permanent magnet 270 with respect to the driving coil 140 in a standstill state of the pendulum which is determined by a centroid position of the pendulum is indicated by the slight deviation d. This deviation direction is the starting direction. If the pendulum is balanced in the transverse direction accurately without deviation so that the center of the permanent magnet in the transverse direction completely coincides with that of the driving coil in a standstill state of the pendulum, the permanent magnet 270 can move neither rightward nor leftward and the pendulum cannot start by itself.

Figure 21:
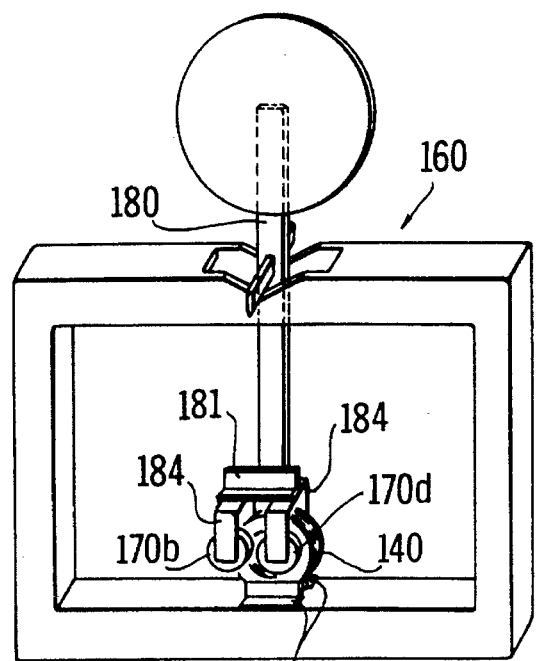
FIG. 21 is a perspective view of a ninth embodiment of the present invention.
Figure 22:
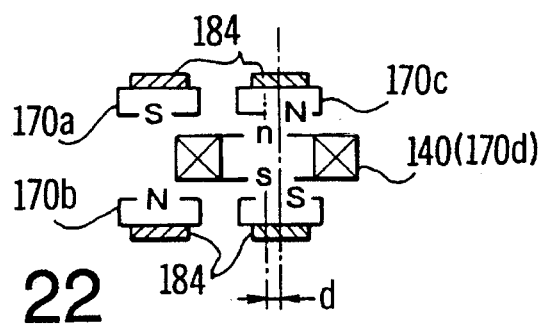
FIG. 22 is a partially enlarged, cross-sectional plan view of the ninth embodiment.

Description is now directed to a ninth embodiment relating to the arrangement of magnetic poles of both same and different polarities. This embodiment, illustrated in FIGS. 21 and 22, is of the same construction as the foregoing fifth embodiment except a relative positional relation between permanent magnet and driving coil.

Reference will now be made to such difference. A magnet mounting member 181 is attached to a lower part of a pendulum 180, and a ]-shaped iron yoke 184, in place of the permanent magnet used in the fifth embodiment, is attached to the underside of one side of the magnet mounting member 181 in such a manner that the opening portion of the yoke faces downward. Two permanent magnets 170a and 170b, which are flat, are fixed respectively to the inner surfaces of the two depending lower portions of the yoke so that their opposed faces are S and N poles, as shown in FIG. 22.

Further, a ]-shaped iron yoke 184 is attached to the underside of an opposite side of the magnet mounting member 181 in a position just under the pendulum in such a manner that the opening portion thereof faces downward. Two flat, permanent magnets 170c and 170d are fixed respectively to the inner surfaces of the two depending lower portions of the yoke so that their opposed faces are N and S poles, as shown in FIG. 22.

On the other hand, a driving coil 140 is disposed in a position substantially just under the pendulum and within the space defined by the permanent magnets 170a, 170b, 170c and 170d in a spaced relation to those magnets, and it is mounted to a base frame 130 through a coil supporting member 130a. In a standstill state of the pendulum, a deviation d is provided between a central line through the magnetic poles of the permanent magnets 170c and 170d located just under the pendulum and a central line through the driving coil 140, as shown in FIG. 22.

The deviation d lies on the right-hand side with respect to the center of the driving coil 140, so when the driving coil is energized, there are generated magnetic poles indicated by n and s in the figure, so that the two permanent magnets 170c and 170d located just under the pendulum undergo a repulsive electromagnetic force acting rightwards in the figure from the driving coil 140, while the two permanent magnets 170a and 170b disposed on one side of the pendulum undergo an attractive electromagnetic force acting rightwards in the figure from the driving coil 140. A combined force of these forces causes the pendulum to start moving. When the magnetic pole centers of the permanent magnets 170a and 170b approach the center of the driving coil 140 and just before reaching the coil center, the supply of electric power to the driving coil is stopped, whereby a swing motion of the pendulum is started by the action of inertia of the pendulum.

This embodiment is characteristic in that the gap in the magnetic circuit can be minimized and that, in the strong magnetic field created by the four permanent magnets, the electric energy in the driving coil can be converted without waste into a mechanical energy. Even if this embodiment is practised in accordance with the invention relating to the circuit using a solar battery of a small light sensing area for interior use, the pendulum including a large and relatively heavy design panel can be swung at a large amplitude.

The iron yoke 7a used in the second embodiment is here mentioned as a yoke for practising the invention relating to the arrangement of magnetic poles of both same and different polarities, in which embodiment the underside of the disc-like iron plate 7a is a ring-shaped S pole since the moving direction of the permanent magnet is not definite longitudinally and transversely. But if the moving direction of the permanent magnet is one direction, there may be used a paper strip-like iron yoke extending in that direction and having three magnetic poles arranged in the order of SNS.

That the present invention is applicable not only to a pendulum using gravity as a restoring force but also to a pendulum using a force other than gravity as a restoring force, will be demonstrated below in terms of a tenth embodiment of the invention with reference to FIG. 23.

Figure 23:
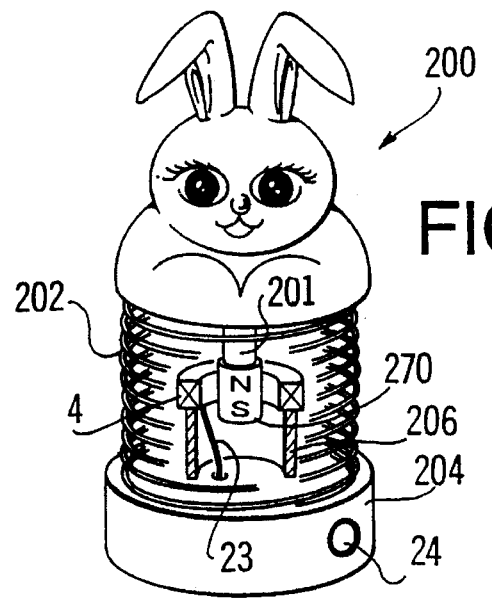
FIG. 23 is a partially cut-away perspective view of a tenth embodiment.

It is an interior accessory toy that is shown in FIG. 23. This is a toy of rabbit 200 made of a non-ferrous metal and oscillating up and down. The resilience of a coiled spring 202 is used as a restoring force.

According to the construction of this toy, dry cells and electronic components of the circuit shown in FIG. 7, though not shown in FIG. 23, are accommodated within a cylindrical base 204. Further, a coil supporting cylinder 206 is fixed to the center of the upper surface of the cylindrical base 204 and an annular driving coil 4 is mounted to the upper end of the cylinder 206 so that the annular surface thereof is horizontal.

On the other hand, a coiled spring 202 is put on the upper surface of the cylindrical base 204, centered on and in surrounding relation to the driving coil 4, and the lower end thereof is fixed to the upper surface of the cylindrical base 204. The upper end of the spring 202 is fixed to the underside of the rabbit 200 formed of a non-ferrous metal by blow molding. The rabbit 200 can undergo free oscillation in the vertical direction on the basis of an intrinsic frequency which is determined by both the mass of the rabbit 200 and the resilience of the spring 202.

For self-starting of such vertical oscillation, a permanent magnet 270 having NS poles in upper and lower positions, respectively, is fixed to the lower end of a magnet mounting rod 201 projecting from the underside of the rabbit 200. The permanent magnet 270 is disposed so that a middle point between the N and S poles of the permanent magnet is positioned near the central point of the annular driving coil 4.

As the environs of this toy grows light, the driving coil 4 is energized intermittently, as explained previously in the second embodiment, and the underside of the rabbit 200 is pushed down or up to start and continue the free oscillation of the rabbit 200 under the same action as the electromagnetic action induced between the annular driving coil 140 and the permanent magnet 270 moving through the driving coil which are shown in FIG. 18 illustrating the seventh embodiment.

The pendulum as referred to herein does not mean the conventional clock pendulum, but means an oscillator which oscillates by virtue of an arbitrary restoring force as in this embodiment.

Figure 24:
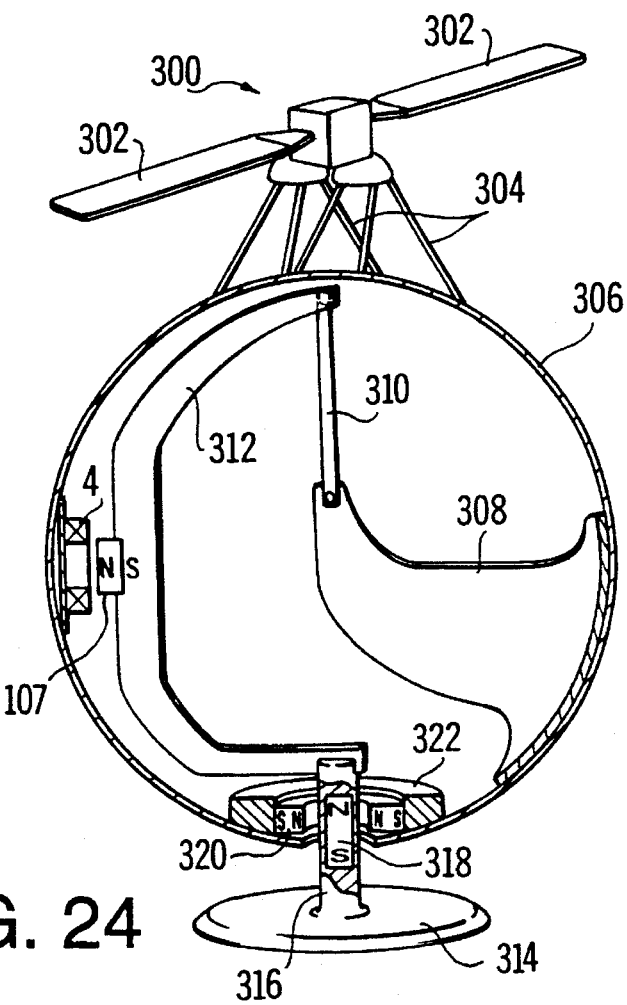
FIG. 24 is a partially cut-away perspective view of an eleventh embodiment of the present invention.

Next, an eleventh embodiment of the present invention will be described below with reference to FIG. 24.

This embodiment concerns an interior accessory ornament having a design of a terrestrial globe and that of a communication satellite. Solar batteries 302 are disposed as both wings of a communication satellite. A very small amount of electric power generated by room light is fed to an electronic circuit formed within a hollow terrestrial globe 306 via satellite supporting wires 304 made of a chromium-plated metal and imitating the radio wave emanating from a parabolic antenna which is provided below the satellite 300.

In the terrestrial globe 306 with the satellite 300 mounted in the north pole position, an annular permanent magnet 320 is fixed to the inside surface of an opening portion formed in the lower end as the south pole of the terrestrial globe. A driving coil 4 is fixed to a left inner surface of the equator of the globe 306 in an inscribed state, while a cantilever 308 is fixed to a right inner surface of the globe 306. A proximal end of the cantilever 308 is positioned centrally of the globe 306, and to an upper portion 408 of the proximal end of the cantilever 308 is mounted the lower end of an elongated thin plate spring 310 made of hardened steel and suspended from the upper end of an arcuate aluminum frame 312. The terrestrial globe 306 with the satellite 300 as the north pole is suspended as the oscillator side by means of the plate spring 310.

On the other hand, as a stationary side, the lower end of the arcuate frame 312 is fixed to the upper end of a brass pipe 316 erected centrally on a disc base 314, and the driving coil 4 fixed to the inside surface of the equator and a permanent magnet 107 opposed to the driving coil through a small gap are fixed to a middle part between the upper and lower ends of the arcuate frame 312.

Further, a rod-like permanent magnet 318 is fixedly accommodated in the interior of the brass pipe 316 in such a manner that its N pole is positioned centrally of the annular permanent magnet 320.

In this embodiment, as illustrated in the figure, the inner peripheral surface of the annular permanent magnet 320 is magnetized as N pole, so this N pole repulses the N pole of the rod-like permanent magnet 318 disposed within the brass pipe 316, and thus the outer peripheral surface of the brass pipe 316 constitutes a contactless bearing without contact with the inner surface of the opening portion of the terrestrial globe. Therefore, there is no mechanical frictional resistance, and a slow horizontal oscillation of the globe can be continued with a slight driving force which resists an extremely slight air viscous drag.

The operation of this embodiment will not be described here because it has already been explained in the third embodiment. But in this embodiment, the terrestrial globe 306 with the satellite as north pole and suspended through the plate spring 310 performs a stable horizontal oscillation in the presence of an annular zinc weight 322, and although the moment of inertia of the hollow globe 306 and that of the annular weight 322 are relatively large, the torsion moment of the plate spring 310 is small, so that the globe performs a slow and steady horizontal oscillation of a long period and a large amplitude as an interior accessory ornament in comparison with the third embodiment.

As the restoring force of the oscillator which is a constituent element of the present invention it is possible to utilize a magnetic moment of a permanent magnet for the terrestrial magnetism. As an example thereof, a terrestrial globe ornament according to a twelfth embodiment will be described below with reference to FIG. 25.

Figure 25:
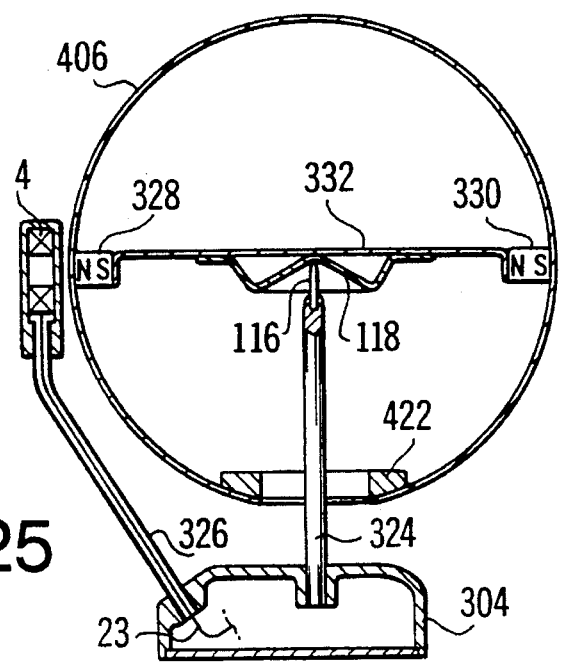
FIG. 25 is a vertically sectional side view of a twelfth embodiment of the present invention.

FIG. 25 is a side view in vertical section. According to the construction of this embodiment, dry cells and the electronic components of the circuit illustrated in FIG. 7 are accommodated in the interior of a cylindrical base 304, though not shown. A support shaft 324 having a pivot shaft 116 at the upper end thereof is erected centrally on the upper surface of the cylindrical base 304, and an L-shaped brass pipe 326 is fixed to a left-hand side of the cylindrical base 304, with a driving coil 4 being fixed to the upper end of the brass pipe 326. A lead wire 23 extends from the driving coil 4 through the brass pipe 326 and is conducted into the cylindrical base 304, in which it is connected to the foregoing circuit.

On the oscillator side, an opening is formed in the lower end corresponding to the south pole of a terrestrial globe formed by blow molding, and an annular zinc weight 422 is fixed to the inside peripheral surface of the said opening. Left and right permanent magnets 328, 330 are fixed to the inside surface of the equator in the terrestrial globe 406. The left and right permanent magnets are interconnected magnetically by means of an iron yoke 332 so that the left-hand face of the left permanent magnet 328, namely the bonding face to the inner surface of the globe, serves as N pole and the right-hand face of the right permanent magnet 330 serves as S pole.

A pivot bearing 118 formed of hardened steel in the shape of a mortar is attached to the underside of a middle portion of the iron yoke 332.

The pivot shaft 116 at the upper end of the support shaft 324 extending through the opening of the terrestrial globe is brought into abutment with the pivot bearing 118 and is supported thereby to support the oscillator side for free pivotal motion in the horizontal direction. As a result, the terrestrial globe 406 pivotally moves horizontally and assumes a stable stationary state in such a manner the permanent magnet 330 of S pole faces the north and the permanent magnet 328 of N pole faces the south under the influence of the terrestrial magnetism.

In this state, when the driving coil 4 opposed through a slight gap to the equator surface on the south side of the globe is energized by the operation of the circuit shown in FIG. 7 in the second embodiment, N pole is created by excitation on the north side of the driving coil. This N pole and the N pole of the permanent magnet 328 repulse each other, so that the oscillator side including the globe pivots horizontally.

As a result, in relation to the terrestrial magnetism, the two permanent magnets 328 and 330 undergo a magnetic moment acting in a returning direction to the original position, and by virtue of this restoring force the terrestrial globe 406 performs an inertial pivotal motion in the horizontal direction at low speed. While the driving coil 4 and the permanent magnet 328 face each other plural times, a time point which permits efficient acceleration of the permanent magnet 328 is selected in accordance with the foregoing operation and the driving coil 4 is energized at that time point, whereby the horizontal pivotal oscillation is accelerated and there occurs an increase of its amplitude angle.

This embodiment is characteristic in that when the amplitude angle of the terrestrial globe 406 which increases gradually with such frequent energization has reached a half-rotation or more of the globe, the globe starts a horizontally rotating motion. This is because the restoring force, or the magnetic moment, acts in the reverse direction at an angle of 180° or more of the magnetic axis of the permanent magnet.

During such rotation of the terrestrial globe, the rotation is accelerated not only by the operation of the apparatus having a magnetic pole arrangement of the same polarity but also by the operation of the apparatus having a magnetic pole arrangement of different polarities at the time of start-up. This point will be explained below.

When the restoring force becomes opposite at an amplitude of a half-rotation or more of the terrestrial globe, such a turn-back reciprocation as before disappears, and the permanent magnet 330 begins to exert an influence of power generation on the driving coil 4. If the periodic energization time-point of the free-running oscillation circuit illustrated in FIG. 7 is about to pass, N pole generated on the right-hand side of the driving coil 4 attracts the S pole of the permanent magnet 330 under energization and exciting action of the driving coil in the invention relating to the arrangement of magnetic poles of different polarities, whereby the rotation of the globe is accelerated. In this way the rotation of the globe is continued while performing both actions alternately or randomly.

A characteristic feature during the rotating motion in this embodiment resides in that the rotation speed of the terrestrial globe does not increase to excess. This is because unless the periodic energizable time-point of the free-running oscillation circuit is not reached, electric power is not supplied to the driving coil 4 no matter how many times the driving coil and the permanent magnets 328, 330 may face and pass each other. Further, as the rotating speed increases, the air resistance increases as well, so that the terrestrial globe rotates stably at a speed which makes the globe easy to see as an ornament.

As the environs of this ornament become dark, the energizing cycle of the free-running oscillation circuit becomes long, and when it becomes no longer possible to continue the rotation of the globe, a shift is made again to the horizontal pivotal oscillation. As the environs become darker, the oscillation amplitude of the globe becomes smaller, and finally the globe comes to stop while the N pole of the permanent magnet 328 faces the south in opposition to the driving coil 4.

Next, as the environs grow light, a horizontal pivotal oscillation is again started, then as the environs grow lighter, the oscillation amplitude increases, and when the environs become still lighter, the rotation of the globe is performed in the manner described above.

Since the present invention is constructed as above, the pendulum 8 which is driven by a relative electromagnetic force between the permanent magnet 7 or an electromagnet and the driving coil 4 does not undergo any restriction at the time of application of power and can be started automatically by itself after release of the restraint force acting to stop the pendulum. This permits the apparatus to be used as a pendulum driving apparatus for a signboard which is apt to be stopped by wind, etc. or for POP advertising. Since the pendulum does not remain stopped, it is possible to enhance the advertising effect.

If a solar battery is used and this solar battery and an electrolytic capacitor for power supply are connected in parallel to constitute a power source, the above self-starting action permits automatic starting as the interior of a room grows light. Thus, while the interior of a room is light, the apparatus provides a pleasure as an interior accessory which continues to move semipermanently without the need of paying attention of the consumption of dry cells, etc. Even in a place difficult to effect maintenance, e.g. a place where an outdoor signboard is mounted, it is possible to swing a large design panel using a solar battery for outdoor use. Also to a moving sculptural shape the apparatus of the invention is applicable as an apparatus affording pleasure and attracting great attention.

Even where dry cells are used as a power source, the supply of electric power to the driving coil conducted for a short time at a rate of one per several reciprocations of the pendulum is performed at a time point corresponding to the most efficient exertion of a repulsive (or attractive) electromagnetic force between permanent magnet and driving coil, the power consumption is decreased and the consumption of the dry cells, etc. is decreased as well, whereby it is made possible to enhance the energy-saving and material-saving effect.

Further, since there adopted means for preventing the electric current generated in the driving coil from flowing other than where required, it is possible to eliminate a damping force which damps the swing motion rapidly, attain a high efficiency apparatus, drive the apparatus even with a very small amount of energy as in room illumination and thereby permit the use of dry cells which are smaller in size and less expensive.

Unlike the prior art, since a detecting coil having a large number of turns is not used for intermittent energization, it is possible to attain both the reduction of cost and that of size.

In the conventional electromagnetic pendulum driving apparatus, the driving coil is energized twice for each reciprocation of the pendulum, whereas in the present invention, since the energizing time ratio is small as noted previously, it is possible to let a relatively large current flow for a short time using a relatively thick driving coil winding. Consequently, a driving coil of a relatively thick, covered copper wire having a relatively small number of turns can be obtained in high yield at low cost in a winding process. In the case of application to a toy or display for POP advertising using a solar battery for low illuminance, it has been necessary to wind an extremely fine or easily cut wire several ten thousand times in the case of a conventional driving coil, while in the present invention wherein the energization time to unenergization time ratio of 1/50, the number of turns is only ten thousand or less (a single supply of electric power is several times or more as large as the conventional apparatus). Thus, even in the use of a solar battery of a very small output, a short-time discharge current can be utilized as the driving coil current by the storage of electricity in an electrolytic capacitor for power supply of a low cost during the long unenergized period. Thus, without using an expensive storage battery, it is possible to attain both a pollution-free long life effect and an economic effect.

Even in the case where the present invention is applied using a power source common to various electronic devices issuing noise signals on the power supply side, the apparatus of the invention can be used as a pendulum driving apparatus of high reliability capable of being prevented from malfunction by the use of an electrolytic capacitor for power supply and a resistor. Even without using such a noise signal-free, expensive voltage stabilizer like the power source for computer, it is possible to prevent erroneous energization at a time point other than the time point at which the electric current in the driving coil 4 drives the pendulum most efficiently.

Further, noise signals are not provided to various electronic devices using a power source common to that in the present invention, thus there is arbitrariness in point of power source and hence it is possible to obtain a pendulum driving apparatus for both alternating current and direct current at low cost.

In the present invention, moreover, there is arbitrariness in the restoring force of oscillation with respect to moving advertisements, moving portions of toys and moving design members of ornaments, and thus there is versatility in the application form.

What is claimed is:

1. A self-starting oscillating ornamental and advertising display apparatus including a swinging portion and a stationary portion, comprising:

a free-running oscillation circuit including a PNP transistor and an NPN transistor, the base of each one of said transistors being connected to the collector of the other of said transistors, a capacitor for setting a time constant being used to connect the base of one transistor to the collector of the other transistor;

a power source connected to said free-running oscillation circuit;

a driving coil connected to the collector of the transistor having said capacitor connected thereto, as a load on that transistor; and a permanent magnet having a relatively repulsive or attractive magnetic pole arrangement of the same polarity or of a different polarity from that of a magnetic pole in a magnetic field which is generated in said driving coil when an electric current is fed to said driving coil from said free-running oscillation circuit, said permanent magnet being relatively movable with respect to said driving coil and capable of performing a relative swinging motion under the action of an arbitrary restoring force, one of said permanent magnet and said driving coil being fixed to said swinging portion and the other being fixed to said stationary portion in a position deviated from a neutral point of a swing motion of the swinging portion;

wherein said power source comprises an electrolytic capacitor for supplying in the form of a short-time discharge current an electric energy necessary for driving said permanent magnet to said driving coil, and a solar battery connected to said electrolytic capacitor for supplying a charging current to compensate for the electric charge lost by said short-time discharge current during an unenergized period of said driving coil.

2. A self-starting oscillating ornamental and advertising display apparatus including a swinging portion and a stationary portion, comprising:

a free-running oscillation circuit including a PNP transistor and an NPN transistor, the base of each one of transistors being connected to the collector of the other of transistors, a capacitor for setting a time constant being used to connect the base of one transistor to the collector of the other transistor;

a power source connected to said free-running oscillation circuit;

a driving coil connected to the collector of the transistor having said capacitor connected thereto, as a load on that transistor; and a permanent magnet having a relatively repulsive or attractive magnetic pole arrangement of the same polarity or of a different polarity from that of a magnetic pole in a magnetic field which is generated in said driving coil when an electric current is fed to said driving coil from said free-running oscillation circuit, said permanent magnet being relatively movable with respect to said driving coil and capable of performing a relative swinging motion under the action of an arbitrary restoring force, one of said permanent magnet and said driving coil being fixed to said swinging portion and the other being fixed to said stationary portion in a position deviated from a neutral point of a swing motion of the swinging portion;

wherein said power source comprises an electrolytic capacitor for supplying in the form of a short-time discharge current an electric energy necessary for driving said permanent magnet to said driving coil, and an arbitrary direct current power source is connected to said electrolytic capacitor through a resistor inserted in series, for supplying a charging current to compensate for the electric charge lost by said short-time discharge during an unenergized period of said driving coil.

* * * * *